(12) United States Patent
Chono

(10) Patent No.: US 7,244,335 B2
(45) Date of Patent: Jul. 17, 2007

(54) SUBSTRATE PROCESSING SYSTEM AND SUBSTRATE PROCESSING METHOD

(75) Inventor: Yasuhiro Chono, Tosu (JP)

(73) Assignee: Tokyo Electron Limited, Tokyo-to (JP)

( * ) Notice: Subject to any disclaimer, the term of this patent is extended or adjusted under 35 U.S.C. 154(b) by 88 days.

(21) Appl. No.: 10/602,041

(22) Filed: Jun. 23, 2003

(65) Prior Publication Data

US 2004/0002224 A1 Jan. 1, 2004

(30) Foreign Application Priority Data

Jun. 26, 2002 (JP) ............................. 2002-185992

(51) Int. Cl.
*H01L 21/306* (2006.01)
*H01L 21/302* (2006.01)
*H01L 21/461* (2006.01)
*C23F 1/00* (2006.01)

(52) U.S. Cl. ........................... 156/345.26; 156/345.28; 156/345.29; 156/345.32

(58) Field of Classification Search ................ 118/715, 118/723 ER, 719, 689, 663, 692, 710; 156/345.26, 156/345.28, 345.29, 345.35, 345.32, 345.43, 156/345.47
See application file for complete search history.

(56) References Cited

U.S. PATENT DOCUMENTS

| 4,798,166 | A | * | 1/1989 | Hirooka et al. ............. 118/719 |
| 4,803,947 | A | * | 2/1989 | Ueki et al. .................. 118/719 |
| 5,281,295 | A | * | 1/1994 | Maeda et al. ........... 156/345.29 |
| 5,632,868 | A | * | 5/1997 | Harada et al. ............... 204/176 |
| 5,904,170 | A | * | 5/1999 | Harvey et al. ................. 137/9 |
| 5,928,428 | A | * | 7/1999 | Horie .......................... 118/724 |
| 6,019,848 | A | * | 2/2000 | Frankel et al. .............. 118/715 |
| 6,065,489 | A | * | 5/2000 | Matsuwaka ................. 137/341 |
| 6,106,659 | A | * | 8/2000 | Spence et al. .......... 156/345.43 |
| 6,764,967 | B2 | * | 7/2004 | Pai et al. ..................... 438/787 |
| 6,833,322 | B2 | * | 12/2004 | Anderson et al. ........... 438/680 |
| 6,869,499 | B2 | * | 3/2005 | Toshima et al. ........ 156/345.29 |
| 2002/0045008 | A1 | * | 4/2002 | Toshima et al. ......... 427/248.1 |
| 2002/0173166 | A1 | * | 11/2002 | Christenson et al. ....... 438/775 |
| 2003/0133854 | A1 | * | 7/2003 | Tabata et al. .......... 422/186.07 |
| 2003/0170949 | A1 | * | 9/2003 | Chouno et al. .............. 438/200 |
| 2004/0002224 | A1 | * | 1/2004 | Chono et al. ................ 438/714 |
| 2004/0063319 | A1 | * | 4/2004 | Toshima et al. ............ 438/689 |
| 2004/0069226 | A1 | * | 4/2004 | Yoshida et al. ............. 118/715 |
| 2004/0101633 | A1 | * | 5/2004 | Zheng et al. ................ 427/551 |
| 2005/0056306 | A1 | * | 3/2005 | Jeong et al. ................ 134/94.1 |
| 2005/0087133 | A1 | * | 4/2005 | Shindo et al. .............. 118/715 |

FOREIGN PATENT DOCUMENTS

JP 63-99529 4/1988

* cited by examiner

*Primary Examiner*—Jeffrie R. Lund
(74) *Attorney, Agent, or Firm*—Morrison & Foerster LLP

(57) ABSTRACT

A substrate processing system is provided with an ozone generator capable of generating an ozone-containing gas by discharging electricity in an oxygen-containing gas, and a plurality of processing chambers each capable of holding substrates therein to process the substrates by the ozone-containing gas supplied thereto. A flow regulator control an oxygen-containing gas supplied to the ozone generator. A controller controls the flow regulator to control the flow rate of the ozone-containing gas to be supplied to the processing chamber or chambers from the ozone generator through the control of the flow rate of the oxygen-containing gas supplied to the ozone generator.

13 Claims, 11 Drawing Sheets

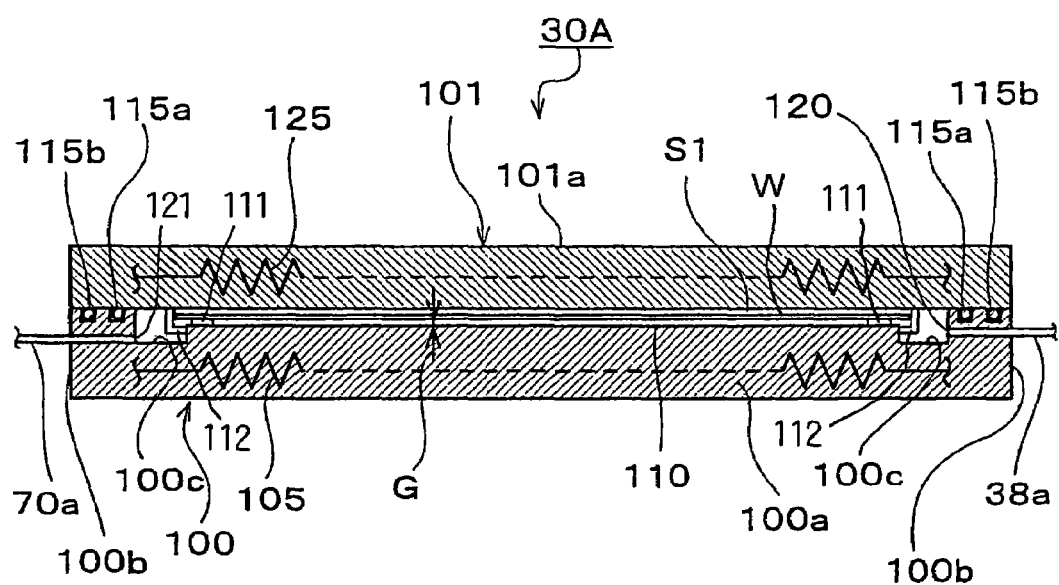
F I G. 4

SUBSTRATE PROCESSING SYSTEM AND SUBSTRATE PROCESSING METHOD

BACKGROUND OF THE INVENTION

1. Field of the Invention

The present invention relates to a substrate processing system and a substrate processing method for processing substrates, such as semiconductor wafers or glass substrates for LCDs (liquid crystal displays).

2. Description of the Related Art

For example, a known resist film removing process for removing a resist film coating a surface of a semiconductor wafer (hereinafter referred to simply as "wafer") included in semiconductor device fabricating processes exposes a wafer placed in a processing chamber to a mixed processing fluid prepared by mixing ozone and steam to alter the resist film into a water-soluble film by oxidation, and then removes the water-soluble film with pure water. A general substrate processing system that performs such a resist film removing process is provided with a plurality of processing chambers, and ozone generated by a single ozone generator is distributed through ozone supply pipes to those processing chambers. The ozone generator generates ozone by discharging electricity in an oxygen-containing gas prepared by mixing oxygen gas and nitrogen gas.

In a general substrate processing system that distributes a processing fluid generated by a single source through branch lines to a plurality of processing chambers, there is the possibility that a wafer loading and unloading operations performed at one of the processing chambers affects on the processing condition of the process being performed in the other processing chambers. For example, in a substrate processing system in which a single processing fluid source supplies a processing fluid through branch lines to two processing chambers, the pressure and flow rate of the processing fluid being supplied to one of the processing chamber vary when a wafer is carried into or carried out of the other processing chamber and thereby the uniformity of a resist-solubilizing process is reduced. Consequently, the uniformity and reliability of the effects of the subsequent processes, such as a resist film removing process and etching process, are deteriorated.

SUMMARY OF THE INVENTION

Accordingly, it is an object of the present invention to provide a substrate processing system and a substrate processing method capable of supplying ozone gas (ozone-containing gas) having a stable ozone concentration into each processing chamber at a stable flow rate even if the processing system is configured so that a common ozone gas source supplies the ozone gas to a plurality of processing chambers.

In order to attain the objective, the present invention provides a substrate processing system, which includes: an ozone generator provided with electrodes and configured to generate an ozone-containing gas by applying an electric discharge produced by the electrodes to an oxygen-containing gas supplied to the ozone generator; a plurality of processing chambers each adapted to process therein a substrate with the ozone-containing gas generated by the ozone generator; a plurality of ozone-containing gas supply lines each connecting the ozone generator to each of the processing chambers; a flow regulator adapted to regulate a flow rate of the oxygen-containing gas supplied to the ozone generator; and a controller configured to determine an ozone-containing gas demand of processes to be carried out in the processing chambers, and configured to control the flow regulator to regulate a flow rate of the oxygen-containing gas being supplied to the ozone generator so that a flow rate of the ozone-containing gas being discharged from the ozone generator to be supplied to the processing chamber or chambers complies with the ozone-containing gas demand.

The present invention further provides a substrate processing system, which includes: an ozone generator provided with electrodes and configured to generate an ozone-containing gas by applying an electric discharge produced by the electrodes to an oxygen-containing gas supplied to the ozone generator; a plurality of processing chambers each adapted to process therein a substrate with the ozone-containing gas generated by the ozone generator; a plurality of ozone-containing gas supply lines each connecting the ozone generator to each of the processing chambers; a plurality of blow-off lines, connected to each of the ozone-containing gas supply lines, adapted to discharge the ozone-containing gas from each of the ozone supply lines before the ozone-containing gas reaches each of the processing chambers; and a plurality of valves each adapted to connect or disconnect each of the blow-off lines to or from each of the ozone-containing gas supply lines.

The present invention further provides a substrate processing system, which includes: a plurality of first gas passages; a plurality of ozone generators each interposed in each of the first gas passages, each of the ozone generators being provided with electrodes and configured to generate an ozone-containing gas by applying an electric discharge produced by the electrodes to an oxygen-containing gas fed from an upstream side of each of the first gas passages to each of the ozone generator in order to discharge the ozone-containing gas therefrom toward a downstream side of each of the first gas passages; a second gas passage connected to the first gas passages; a plurality of processing chambers each adapted to process therein a substrate with the ozone-containing gas generated by the ozone generators; a plurality of third gas passages branched from the second gas passage and connected respectively to the processing chambers to supply the ozone-containing gas to the processing chambers; and a controller configured to determine an ozone-containing gas demand of processes to be carried out in the processing chambers, and configured to control a state of at least one of the ozone generators between a first state in which said at least one of the ozone generators is generating the ozone-containing gas and a second state in which said at least one of the ozone generator stops generating the ozone-containing gas so that a sum of flow rates being discharged from the ozone generators toward the downstream sides of the first gas passages complies with the ozone gas demand.

According to another aspect of the present invention, a substrate processing method is provided, the method including the steps of: providing a processing system including an ozone generator having electrodes, and a plurality of processing chambers each adapted to process a substrate therein by using an ozone-containing gas generated by the ozone generator; determining an ozone-containing gas demand of processes to be carried out in the processing chambers; feeding an oxygen-containing gas to the ozone generator at a flow rate that enables the ozone generator to discharge an ozone-containing gas at a flow rate that complies with the ozone-containing gas demand; applying a voltage across the electrodes of the ozone generator to produce an electric discharge, thereby producing an ozone-containing gas by applying the electric discharge to the oxygen-containing gas fed to the ozone generator; supplying the ozone-containing gas thus generated by the ozone generator and discharged therefrom to the processing chamber or chambers, thereby processing a substrate accommodated in each of the processing chamber or chambers with the ozone-containing gas; and changing the flow rate of the oxygen-containing gas being fed to the ozone generator, if the ozone-containing gas demand changes.

The present invention further provides a substrate processing method including the steps of: providing a processing system including an ozone generator having electrodes, and a plurality of processing chambers each adapted to process a substrate therein by using an ozone-containing gas supplied by the ozone generator; determining whether or not each of the processing chambers requires the ozone-containing gas; feeding an oxygen-containing gas to the ozone generator; applying a voltage across the electrodes of the ozone generator to produce an electric discharge, thereby producing an ozone-containing gas by applying the electric discharge to the oxygen-containing gas fed to the ozone generator; supplying the ozone-containing gas thus generated by the ozone generator only to the chamber or chambers that are requiring the ozone-containing gas, thereby processing a substrate accommodated in each of the processing chamber or chambers with the ozone-containing gas; and discarding a part of the ozone-containing gas generated by the ozone generator without supplying it to any one of the processing chambers.

The present invention further provides a substrate processing method including the steps of: providing a processing system including a plurality of ozone generators each having electrodes, and a plurality of processing chambers each adapted to process a substrate therein by using an ozone-containing gas supplied by the ozone generator; determining an ozone-containing gas demand of processes to be carried out in the processing chambers; determining the number of the ozone generators to be operated to generate an ozone-containing gas based on the ozone-containing gas demand; feeding an oxygen-containing gas to the ozone generator or generators determined to be operated; applying a voltage across the electrodes of the ozone generator or generators determined to be operated to produce an electric discharge, thereby producing an ozone-containing gas by applying the electric discharge to the oxygen-containing gas fed to the ozone generator or generators; supplying the ozone-containing gas thus generated by the ozone generator or generators to the processing chamber or chambers, thereby processing a substrate accommodated in each of the processing chamber or chambers with the ozone-containing gas; changing the number of the ozone generators to be operated, if the ozone-containing gas demand is increased or decreased.

BRIEF DESCRIPTION OF THE DRAWINGS

FIG. 4 is a longitudinal sectional view of a processing vessel included in the substrate processing system shown in FIG. 1;

DESCRIPTION OF THE PREFERRED EMBODIMENTS

Figure 1:
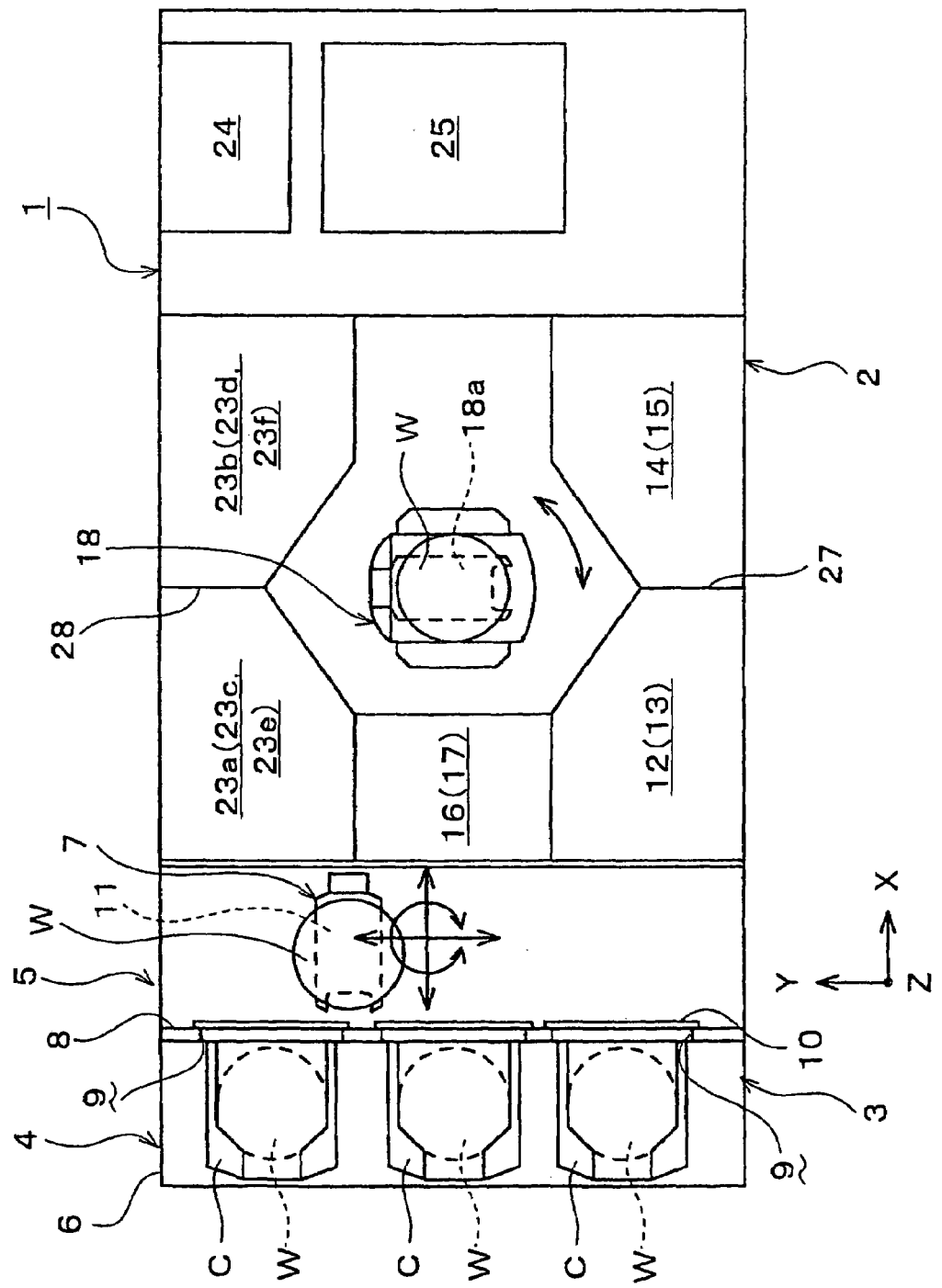
FIG. 1 is a schematic plan view of a substrate processing system according to the present invention.
Figure 2:
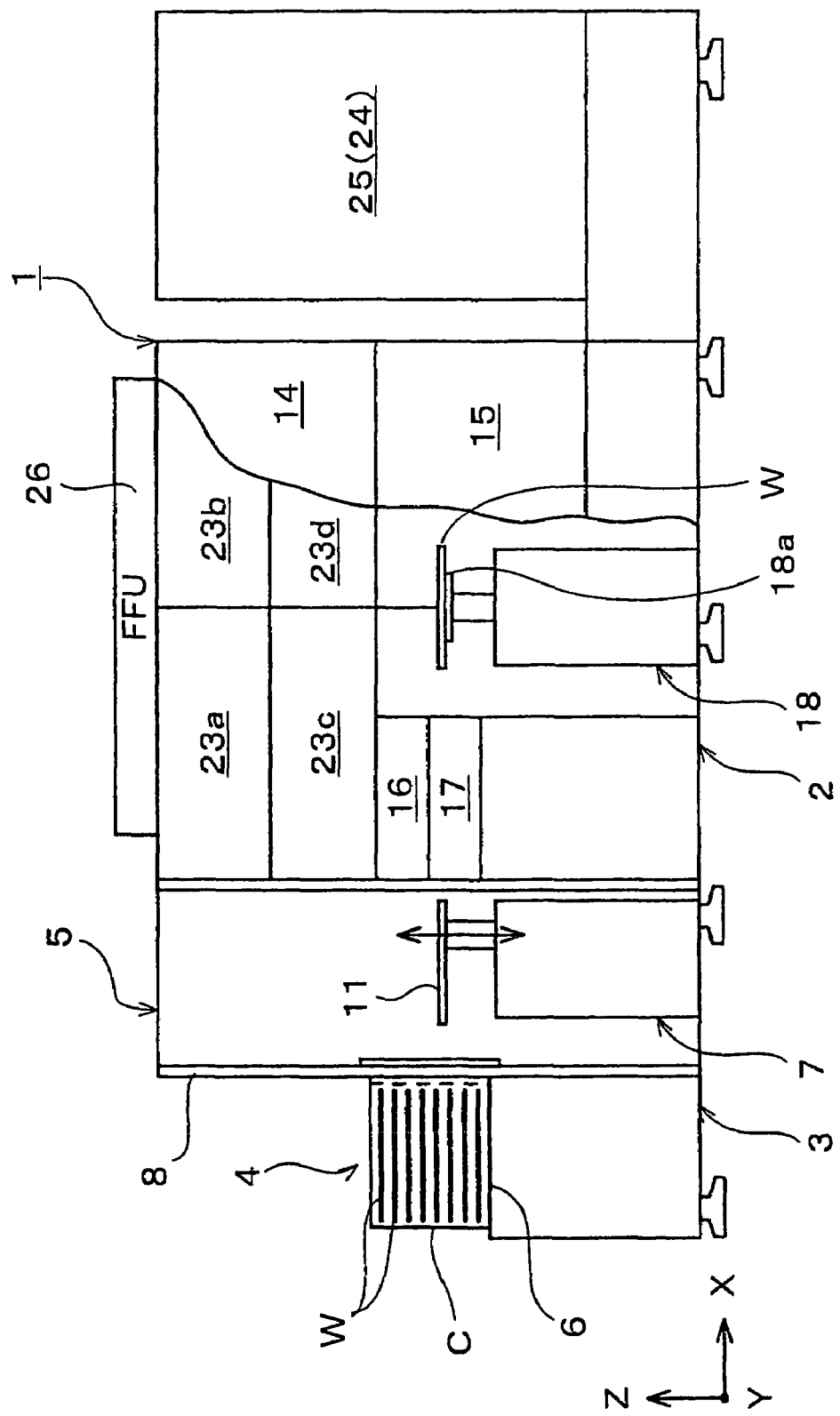
FIG. 2 is a schematic side elevation of the substrate processing system shown in FIG. 1.

FIGS. 1 and 2 show a substrate processing system 1 according to the present invention for carrying out a resist-solubilizing process and a resist film removing process. The substrate processing system 1 includes a substrate processing section 2 for processing a wafer W (i.e., a substrate) by a cleaning process and a resist-solubilizing process, and a wafer transfer section 3 for carrying a wafer W into the substrate processing section 2 and vice versa.

The wafer transfer section 3 includes an in/out port 4 provided with a table 6 for supporting wafer carriers C each capable of holding, for example, twenty-five disk-shaped wafers W, thereon, and a wafer carrying area 5 provided with a wafer conveyer 7 for transferring wafers W from the wafer carrier C placed on the table 6 to the substrate processing section 2 and vice versa.

The wafer carrier C has one side provided with an opening covered with a cover. The cover of the wafer carrier C is opened to take out wafers W from and to put wafers W into the wafer carrier C. Shelves are supported on the inner surfaces of walls of the wafer carrier C to support wafers W at predetermined intervals. The shelves define, for example, twenty-five slots for accommodating wafers W. One wafer W is inserted in each of the slots with its major surface (on which semiconductor devices are formed) facing up.

For example, three wafer carriers C can be arranged along the Y-axis in a horizontal plane at predetermined positions on the table 6 of the in/out port 4. The wafer carrier C is placed on the table 6 with its side provided with the cover faced toward a partition wall 8 separating the in/out port 4 and the wafer carrying area 5. Windows 9 are formed in the partition wall 8 at positions corresponding to the positions where the wafer carriers C are placed on the table 6. Shutters (not shown) are installed on the side of the wafer carrying area 5 with respect to the windows 9, and the shutters are operated by shutter operating mechanisms 10 to open and close the windows 9.

Each of the shutter operating mechanisms 10 is also capable of opening and closing the cover of the wafer carrier C. The shutter operating mechanism opens and closes the shutter covering the window 9 and the cover of the wafer carrier C simultaneously. After the window 9 and the open side of the wafer carrier C have been opened, the wafer conveyer 7 arranged in the wafer carrying area 5 is able to access the wafer carrier C to carry a wafer W.

The wafer conveyer 7 placed in the wafer carrying area 5 is horizontally movable along the Y-axis, is vertically movable along the Z-axis, and is turnable in the θ-direction in a horizontal plane, i.e., XY-plane. The wafer conveyer 7 has a wafer transfer arm 11 capable of holding and carrying a wafer W. The wafer transfer arm 11 is horizontally movable along the X-axis. Thus, the wafer conveyer 7 is capable of accessing every one of the slots, at different levels, of the wafer carrier C placed on the table 6 and each of two vertically arranged wafer delivery units 16 and 17. Accordingly, the wafer conveyer 7 is capable of transferring the wafer from the in/out port 4 to the substrate processing section 2 and vice versa.

The substrate processing section 2 includes a main wafer conveyer 18, the wafer delivery units 16 and 17 for temporarily holding a wafer W before delivery, four substrate cleaning units 12, 13, 14 and 15, and substrate processing units 23a to 23f for subjecting wafers W to a resist-solubilizing process for altering resist films into a water-soluble condition.

The substrate processing section 2 is provided with an ozone producing unit 24 including an ozone generator 42, and a chemical liquid storage unit 25 storing a processing liquid to be supplied to the substrate cleaning units 12, 13, 14 and 15. An ozone-containing gas produced by the ozone producing unit 24 is supplied to the substrate processing units 23a to 23f.

A fan filter unit (FFU) 26 is installed on the top wall of the substrate processing section 2 to supply clean air to those units and the main wafer conveyer 18. Part of clean air blown downward by the FFU 26 flows through the wafer transfer units 16 and 17 and a space extending over the wafer transfer units 16 and 17 into the wafer carrying area 5. Thus, contaminants, such as particles, are prevented from migrating from the wafer carrying area 5 into the substrate processing section 2 to keep the interior of the substrate processing section 2 clean.

Each of the wafer delivery units 16 and 17 (i.e., wafer relay units 16, 17) is capable of holding temporarily a wafer W received from the wafer conveyer 7 and a wafer to be delivered to the wafer conveyer 7. The wafer transfer units 16 and 17 are stacked vertically. The upper wafer transfer unit 16 may be used for transferring a wafer W from the substrate processing section 2 to the in/out port 4, and the lower wafer transfer unit 17 may be used for transferring a wafer W from the in/out port 4 to the substrate processing section 2.

The main wafer conveyer 18 is has a base movable in directions parallel to the X-axis and the Z axis and is turnable in the θ-direction in an XY-plane. The main wafer conveyer 18 has a carrying arm 18a mounted to the base thereof and capable of holding a wafer W. The carrying arm 18a is capable of moving in directions parallel to the Y-axis when the base of the wafer conveyer 18 is in an angular position shown in FIG. 1. Thus, the main wafer conveyer 18 is able to access the wafer delivery units 16 and 17, the substrate cleaning units 12 to 15 and the substrate processing units 23a to 23f.

The substrate cleaning units 12, 13, 14 and 15 perform a cleaning process and a drying process to clean and dry wafers W processed by the resist-solubilizing process by the substrate processing units 23a to 23f. The two wafer cleaning units 12 and 13 are stacked, and the two wafer cleaning units 14 and 15 are stacked. The wafer cleaning units 12 to 15 are substantially similar in construction, except that the two wafer cleaning units 12, 13 and the two wafer cleaning units 14, 15 are symmetrical with respect to a wall 27 separating the two wafer cleaning units 12, 13 and the two wafer cleaning units 14, 15 as shown in FIG. 1.

The substrate processing units 23a to 23f perform the resist-solubilizing process for making resist films formed on the surfaces of wafers W water-soluble. As shown in FIG. 2, the substrate processing units 23a to 23f are stacked in two stacks; the substrate processing units 23e, 23c and 23a are stacked up in that order in the left stack, and the substrate processing units 23f, 23d and 23b are stacked up in that order in the right stack. The substrate processing units 23a to 23f are virtually similar in construction, except that the substrate processing units 23a and 23b, the substrate processing units 23c and 23d, and the substrate processing units 23e and 23f are symmetrical, respectively, with respect to a wall 28 separating the right and the left stack as shown in FIG. 1. A piping system for the substrate processing units 23a and 23b, a piping system for the substrate processing units 23c and 23d, and a piping system for the substrate processing units 23e and 23f are similar. The substrate processing units 23a and 23b, and the piping system for the substrate processing units 23a and 23b will be described by way of example.

Figure 3:
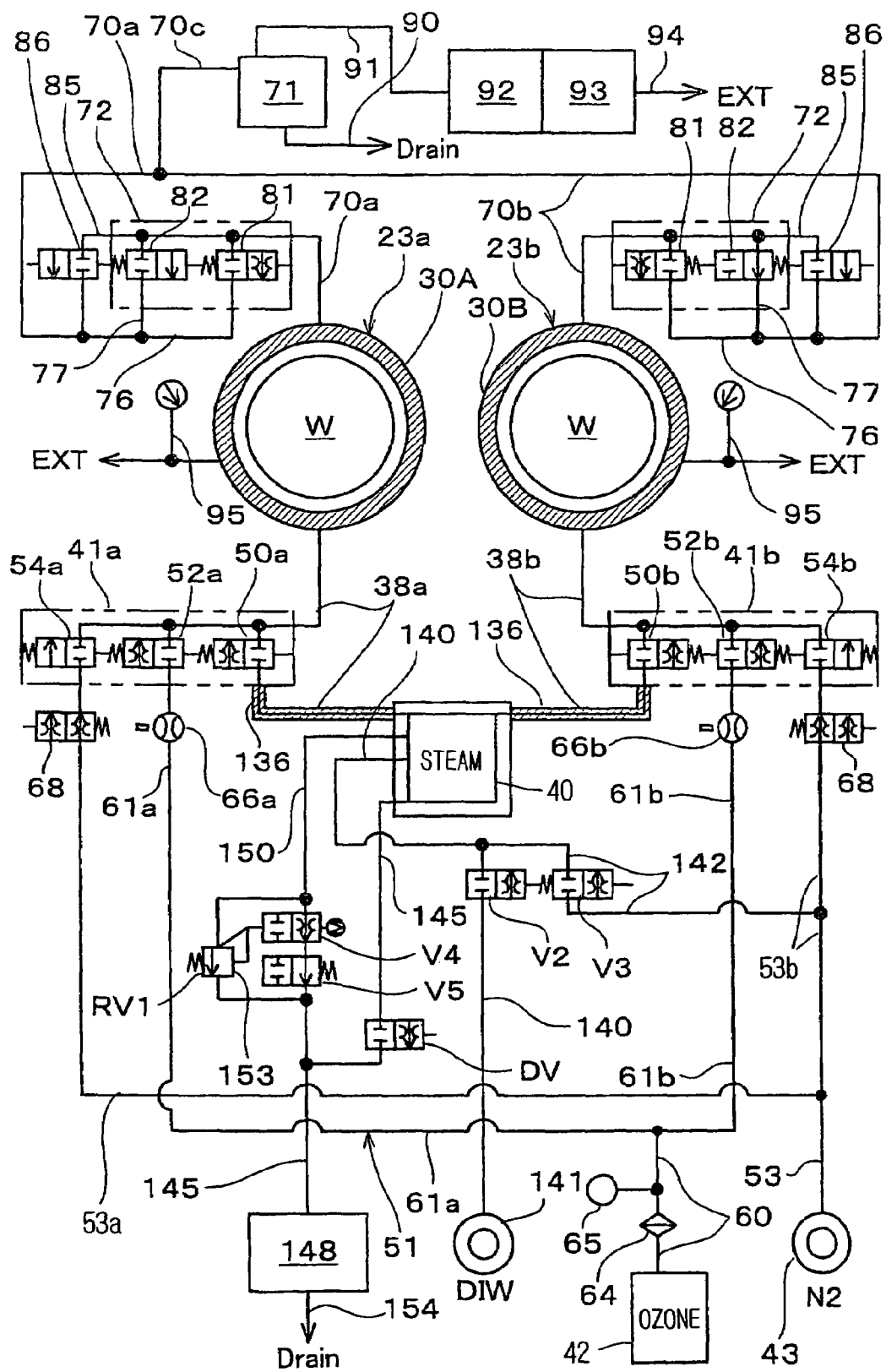
FIG. 3 is a piping diagram of a piping system included in the substrate processing system shown in FIG. 1.

FIG. 3 shows the piping system for the substrate processing units 23a and 23b. The substrate processing units 23a and 23b are provided with processing vessels (i.e., processing chambers) 30A and 30B, respectively. Each of the processing vessels 30A and 30B is adapted to hold a wafer W therein. The processing vessels 30A and 30B are connected respectively by steam supply pipes 38a and 38b (hereinafter referred to as "main supply pipes 38a and 38b") to a steam generator 40.

The ozone generator 42 and a nitrogen gas source 43 are connected to the main supply pipe 38a through a supply selector 41a, and are connected to the main supply pipe 38b through a supply selector 41b. The ozone generator 42 is included in the ozone producing unit 24. The supply selectors 41a and 41b include flow regulating valves 50a and 50b, flow regulating valves 52a and 52b, and stop valves 54a and 54b, respectively.

The flow regulating valve 50a (50b) is capable of connecting and disconnecting the corresponding processing vessel 30A (30B) to and from the steam generator 40, and also capable of regulating the flow rate of wafer vapor (steam) to be supplied to the corresponding processing vessel 30A (30B) from the steam generator 40.

The flow regulating valve 52a (52b) is capable of connecting and disconnecting the corresponding processing vessel 30A (30B) to and from the ozone generator 42, and also capable of regulating the flow rate of the ozone-containing gas to be supplied to the corresponding processing vessel 30A (30B) from the ozone generator 42.

The stop valve 54a (54b) is capable of connecting and disconnecting the processing vessel 30A (30B) to and from a nitrogen gas source 43.

Connected to the ozone generator 42 is an ozone-containing gas supply main pipe 60, which is divided into two ozone-containing gas supply branch pipes 61a and 61b. The branch pipes 61a and 61b are connected through the flow regulating valves 52a and 52b to the main supply pipes 38a and 38b, respectively. Thus, the main supply pipe 60, the branch pipes 61a, 61b, and the main supply pipes 38a, 38b constitute ozone-containing gas supply lines that carry an ozone-containing gas generated by the ozone generator 42 to the processing vessels 30A, 30B, respectively. A filter 64 and an ozone concentration measuring device 65 for measuring the ozone concentration of the ozone-containing gas produced by the ozone generator 42 are placed in that order from the side of the ozone generator 42 in the ozone-containing gas supply main pipe 60. Flow meters 66a and 66b and the flow regulating valves 52a and 52b are placed in that order from the side of the ozone generator 42 in the ozone-containing gas supply branch pipes 61a and 61b, respectively. The flow meters 66a and 66b measure respective flow rates of the ozone-containing gas being supplied to the processing vessels 30A and 30B.

The respective flow regulating characteristics of the flow regulating valves 52a and 52b are adjusted beforehand such that the flow rates measured by the flow meters 66a and 66b are equal, when the flow regulating valves 52a and 52b are opened. When both the flow regulating valves 52a and 52b are opened, the ozone-containing gas carried by the ozone-containing gas supply main pipe 60 is distributed equally to the branch ozone-containing gas supply pipes 61a and 61b, flows at the same flow rates into the processing vessels 30A and 30B. Supposing the ozone-containing gas is supplied into the ozone-containing gas supply main pipe 60 at about 8 l/min, the ozone-containing gas flows through each of the ozone-containing gas supply branch pipes 61a and 61b at about 4 l/min.

Connected to the nitrogen gas source 43 is a nitrogen gas supply pipe 53, which is divided into two nitrogen gas supply branch pipes 53a and 53b. The branch pipes 53a and 53b are connected, through flow selector valves 68, 68 and to the stop valves 54a and 54b of the supply selectors 41a and 41b in that order from the side of the nitrogen gas source 43, to the main supply pipes 38a and 38b, respectively. Each of the flow selector valves 68 has a high-flow position and a low-flow position.

The flow regulating valves 50a and 50b can be adjusted such that steam generated by the steam generator 40 is supplied through the main supply pipes 38a and 38b into the processing vessels 30A and 30B at equal flow rates. Nitrogen gas can be supplied, from the nitrogen gas source 43 through the nitrogen gas supply branch pipes 53a and 53b and the main supply pipes 38a and 38b, into the processing vessels 30A and 30B at equal flow rates, if the positions (high-flow position or low-flow position) of the flow selector valves 68 are the same.

Discharge pipes 70a and 70b are connected to parts of the processing vessels 30A and 30B respectively diametrically opposite to parts of the processing vessels 30A and 30B to which the main supply pipes 38a and 38b are connected. The discharge pipes 70a and 70b are joined to a discharge pipe 70c connected to a mist trap 71. Discharge selectors 72 serving as pressure regulators for the processing vessels 30A and 30B are provided in the discharge pipes 70a and 70b, respectively.

Each of the discharge pipes 70a and 70b are divided into three branch pipes 76, 77 and 85, respectively. The branch pipe 76 is provided with a first switch valve 81. The branch pipe 77 is provided with a second switch valve 82. The branch pipe 85 is provided with a third switch valve 86. The first switch valve 81 has a restrictor therein and allows a fluid to flow therethrough at a relatively low flow rate, when opened. The second switch valve 82 allows a fluid to flow therethrough at a relatively high flow rate, when opened. Normally, the third switch valve 86 is closed. The third switch valve 86 opens in a state of emergency, such as a state where the internal pressure of the processing vessel 30A (30B) becomes excessively high. The downstream ends of the branch pipes 76, 77 and 85 are joined together into a single discharge pipe 70a (70b) again. Each of the discharge selectors 72 are composed of the branch pipes 76 and 77 and the first and the second switch valves 81 and 82.

The mist trap 71 cools a processing fluid discharged from the processing vessels 30A and 30B, separates the liquid contained in the discharged processing fluid from the ozone-containing gas contained in the discharged processing fluid, and drains the liquid through a drain pipe 90. A discharge pipe 91 carries the ozone-containing gas thus extracted from the discharged processing fluid to an ozone killer 92. The ozone killer 92 decomposes ozone contained in the ozone-containing gas into oxygen by thermal decomposition, cools the oxygen and discharges the cooled oxygen through a discharge pipe 94.

As mentioned above, the flow regulating valves 50a and 50b regulate the flow rates of steam supplied to the processing vessels 30A and 30B, respectively. The flow regulating valves 52a and 25b regulates the flow rates of the oxygen-containing gas supplied to the processing vessels 30A and 30B, respectively. The discharge selector 72 regulate, by selectively opening the first or second switch valve 81, 82, the rates of discharge of fluids from the processing vessels 30A and 30B to control the pressures of steam, ozone-containing gas or the processing fluid containing steam and the ozone-containing gas in the processing vessels 30A and 30B, respectively.

Leak detectors 95 are connected respectively to the processing vessels 30A and 30B to monitor the leakage of the processing fluid from the processing vessels 30A and 30B.

The processing vessels 30A and 30B are the same in construction and hence only the processing vessel 30A will be described by way of example. Referring to FIG. 4, the processing vessel 30A has, as principal components, a vessel body 100 for holding a wafer W therein, and a cover 101 for transferring a wafer W from the main wafer conveyer 18 to the vessel body 100 and vice versa. A cover lifting mechanism (not shown) including a cylinder actuator (not shown) separates the cover 101 from the vessel body 100 when the cover 101 receives a wafer W from the main wafer conveyer 18, and joins the cover 101 closely to the vessel body 100 while a wafer W is processed in the processing vessel 30A. A sealed processing space S1 is formed by closely joining the vessel body 100 and the cover 101 together.

The vessel body 100 has a disk-shaped base 100a, and an annular circumferential wall 100b rising from a peripheral part of the base 100a. The base 100a is internally provided with a heater 105. A circular land 110 of a diameter smaller than that of a wafer W is formed on an upper surface of the base 100a. The upper surface of the circular land 110 is at a level below that of the upper surface of the circumferential wall 100b. An annular groove 100c is formed between the circumferential wall 100b and the circular land 110.

Four support members 111, for supporting a wafer W placed in the vessel body 100, are disposed at four positions in a peripheral part of the circular land 110. The four support members 111 support a wafer W placed thereon stably in place. A gap G of about 1 mm is formed between the lower surface of a wafer W supported in place by the support members 111 and the upper surface of the circular land 110. The support members 111 are formed of a resin, such as a PTFE resin.

Two concentric circular grooves are formed in the upper surface of the circumferential wall 100b. Two O-rings 115a and 115b are fitted in the circular grooves to seal gaps between the upper surface of the circumferential wall 100b and the lower surface of the cover 101 so that the processing space S1 may be sealed when the vessel body 100 and the cover 101 are joined together.

A supply port 120 is formed in the circumferential wall 100b. The processing fluid is supplied through the supply port 120 into the processing vessel 30A. A discharge port 121 is formed in the circumferential wall 110b at a position diametrically opposite to the supply port 120. The main supply pipe 38a and the discharge pipe 70a are connected, respectively, to the supply port 120 and the discharge port 121.

The supply port 120 and the discharge port 121 open into an upper part and a lower part, respectively, of the annular groove 100c. The arrangement of the ports 120 and 121 enables the processing fluid to be supplied smoothly through the supply port 120 into the processing space S1 so that the processing fluid may not stagnate, and also prevents the processing fluid from remaining in the processing vessel 30A when the processing fluid is discharged from the processing vessel 30A.

In fact, the supply port 120 opens into a space between the two adjacent support members 111, and the discharge port 121 opens into a space between the other two adjacent support members 111, so that the processing fluid is smoothly supplied into and discharged from the processing vessel 30A without being obstructed by the support members. However, in FIG. 4, the support members 111 are shown as being diametrically aligned with the supply and discharge ports 120 and 121 to the contrary, for simplicity of the drawing.

The cover 101 has a body 101a internally provided with a heater 125, and a pair of holding members 112 projecting downward from diametrically opposite parts of the lower surface of the cover 101. Each of the holding members 112 have a substantially L-shaped section, and has a tip portion bent radially inward, on which a wafer W is placed. When a cover lifting mechanism lowers the cover 101 toward the vessel body 100, the holding members 112 holding a wafer W advance into the annular groove 100c to place the wafer W on the support members 111 of the vessel body 100.

The steam generator 40 has a tank (not shown), into which pure water is supplied from a pure water (DIW) source 141. The steam generator 40 generates steam, or a water vapor, by heating the pure water contained in the tank with a heater. The interior space of the tank is kept at temperature of about 120° C. and in a pressurized state. Referring to FIG. 3, parts, extending between the steam generator 40 and the supply selector 41a and 41b, of the main supply pipes 38a and 38b are covered with tubular temperature regulators 136. The regulators 136 regulate the temperature of steam flowing from the steam generator 40 to the supply selector 41a and 41b.

A flow regulating valve V2 is placed in a pure water supply pipe 140, which carries pure water from the pure water source 141 to the steam generator 40. A branch pipe 142 branched from the nitrogen gas supply branch pipe 53b connected to the nitrogen gas source 43 is connected to a part, between the flow regulating valve V2 and the steam generator 40, of the pure water supply pipe 140. The branch pipe 142 is provided therein with a flow regulating valve V3. The flow regulating valves V2 and V3 are capable of not only regulating the flow rates of the fluids flowing through the pipes 140 and 142, but also opening and shutting-off the pipes 140 and 142, respectively.

A drain pipe 145 is connected to the not-shown tank of the steam generator 40 to drain pure water therefrom. The drain pipe 145 is provided with a drain valve DV interlocked with the flow regulating valve V3 in the branch pipe 142. The drain pipe 145 has a downstream end connected to a mist trap 148. A pressure-relief pipe 150 is connected to the not-shown tank of the steam generator 40 to discharge steam therefrom to prevent the internal pressure of the tank of the steam generator 40 from increasing beyond a specified limit. The pressure-relief pipe 150 is also used for controlling the flow rates of steam to be supplied to the processing vessels 30A and 30B, as mentioned later. The downstream end of the pressure-relief pipe 150 is connected to a part, on the downstream side of the drain valve DV, of the drain pipe 145. The pressure-relief pipe 150 is provided with a flow regulating valve V4 and a stop valve V5. A branch pipe 153 is connected to the pressure-relief pipe 150. One end the branch pipe 153 is connected to a part, on the upstream side of the flow regulating valve V4, of the pressure-relief pipe 150, and the other end of the branch pipe 153 is connected to a part, on the downstream side of the stop valve V5, of the pressure-relief pipe 150. The branch pipe is provided with a pressure-relief valve RV1. The mist trap 148 cools pure water drained through the drain pipe 145 and steam discharged through the pressure-relief pipe 150, and drains therefrom cooled pure water and condensed steam through a drain pipe 154.

The heater of the steam generator 40 is supplied with a fixed electric power in order to keep the steam generating rate of the steam generator 40 constant. As mentioned above, the flow regulating characteristics of the flow regulating valves 50a and 50b are adjusted beforehand such that steam generated by the steam generator 40 is supplied to the processing vessels 30A and 30B at equal flow rates, respectively.

Now, it is supposed that the steam generator generates five units of steam per unit time.

In the event that steam needs to be supplied to both the processing vessels 30A and 30B simultaneously, two units of steam are supplied per unit time to the processing vessel 30A, two units of steam are supplied per unit time to the processing vessel 30B, and one unit of steam is discharged per unit time from the steam generator 40 through the pressure-relief pipe 150. In this case, the flow regulating valve V4 is adjusted so that one unit of steam flows per unit time through the pressure-relief pipe 150, and the flow regulating valves 50a and 50b and the stop valve V5 of the pressure-relief pipe 150 are opened.

In a case where steam needs to be supplied only to the processing vessel 30A or the processing vessel 30B, such as a case where a wafer W is carried into the processing vessel 30A (or 30B) and, at the same time, a resist water-solubilizing process using steam and the ozone-containing gas is carried out in the processing vessel 30B (or 30A), two units of steam per unit time out of five units of steam generated per unit time by the steam generator 40 are supplied only to the processing vessel 30B (or 30A), and three units of steam are discharged per unit time through the pressure-relief pipe 150. Therefore, the flow regulating valve V4 is adjusted so that three units of steam out of five units of steam are discharged per unit time through the pressure-relief pipe 150, the flow regulating valve 50a (or 50b) is closed and the stop valve V5 is opened when steam needs to be supplied only to the processing vessel 30B (or 30A).

When neither the processing vessel 30A nor the processing vessel 30B needs steam, all the steam generated by the steam generator 40 is discharged through the pressure-relief pipe 150 by closing both the flow regulating valves 50a and 50b and opening the stop valve V5 and the flow regulating valve V4.

In order to perform the above operation effectively, each of the flow regulating valves 50a and 50b is provided therein with a variable throttle capable of being adjusted beforehand, and a shut-off valve capable of adopting only a fully-opened position and a closed position. The openings of the variable throttles of the flow regulating valves 50a and 50b are adjusted beforehand such that the stem generated by the steam generator 40 is evenly distributed to the main supply pipes 38a and 38b and to the processing chambers 30A and 30B, when both the shut-off valves of the flow regulating valves 50a and 50b are opened.

The flow regulating valves 52a and 52b for regulating ozone-containing gas have the same structure as that of the flow regulating valves 50a and 50b. Thus, each of the flow regulating valves 52a and 52b includes a variable throttle and a shut-off valve.

Steam discharged from the steam generator 40 through the pressure-relief pipe 150 is carried to the mist trap 148 by the drain pipe 145. The pressure-relief valve RV1 opens when the internal pressure of the tank 130 increases beyond a specified limit to discharge steam from the tank 130 through the pressure-relief pipe 150, the branch pipe 153, the pressure-relief pipe 150 and the drain pipe 145.

The flow rates of steam supplied to the processing vessels 30A and 30B can be adjusted by discharging steam generated by the steam generator 40 at a proper discharge rate regulated by the flow regulating valve V4. Even if the steam demand of the processes to be carried out by the processing vessels (in other words, the number of the processing vessels simultaneously needing steam, for example) is changed, the flow regulating characteristics (the openings of the variable throttles) of the flow regulating valves 50a and 50b adjusted beforehand do not need to be changed, and only the shut-off valves of the flow regulating valve 50a and/or the flow regulating valve 50b need to be opened and/or closed. The aforementioned method of regulating the flow rates of steam flowing into the processing vessels 30A and 30B using the flow regulating valve V4 is easier than a flow regulating method that controls the openings of the flow regulating valves 50a and 50b or a flow regulating method that controls the output of a heater to control the steam generating rate of the steam generator 40. Thus, the flow rates of steam being supplied to the processing vessels 30A and 30B can accurately be regulated according to processes to be carried out in the processing vessels 30A and 30B, which improves the uniformity of the effect and the reliability of the resist-solubilizing process.

Figure 5:
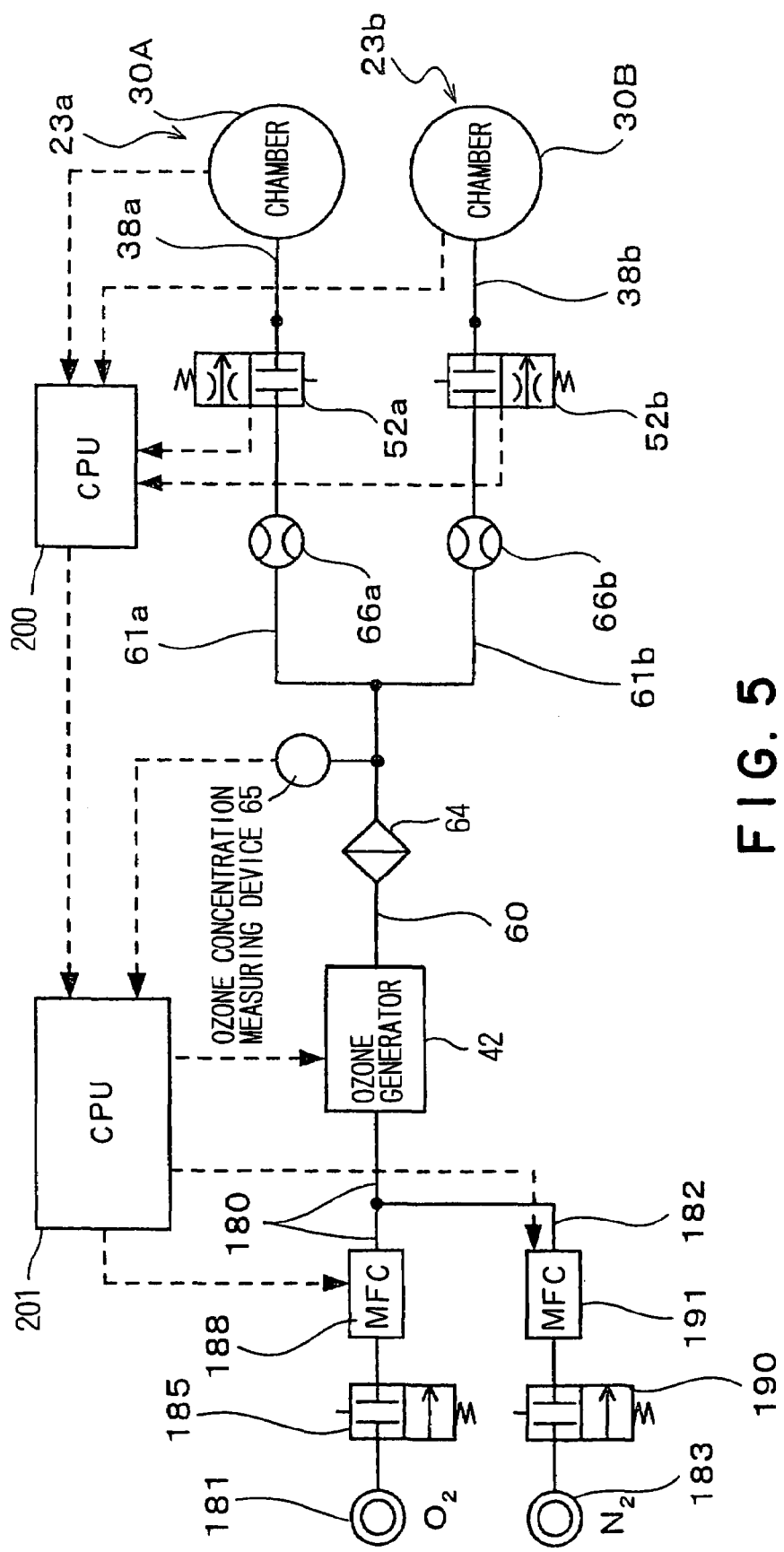
FIG. 5 is a detailed piping diagram of a piping system relating to an ozone supply, which is extracted from the entire piping system of the processing system shown in FIG. 3.

FIG. 5 shows a piping diagram of a piping system relating to the ozone supply, which is extracted from the entire piping system of the processing system shown in FIG. 3 for the purpose of detailed explanation. An oxygen gas source 181 is connected to the ozone generator 42 by an oxygen gas supply pipe 180. A nitrogen gas supply pipe 182 has one end connected to a nitrogen gas source 183 and the other end connected to the oxygen gas supply pipe 180. A stop valve 185, and a mass flow controller 188, i.e., a flow regulating device for regulating the flow of oxygen gas to the ozone generator 42 are arranged in that order from the side of the oxygen gas source 181 in the oxygen gas supply pipe 180. The nitrogen gas supply pipe 182 is connected to a part, on the downstream side of the mass flow controller 188, of the oxygen gas supply pipe 180. A stop valve 190, and a mass flow controller 191, i.e., a flow regulating device for regulating the flow of nitrogen gas supplied to the ozone generator 42, are arranged in that order from the side of the nitrogen gas source 183 in the nitrogen gas supply pipe 182. Oxygen gas supplied from the oxygen gas source 181 and nitrogen gas supplied from the nitrogen gas source 183 flow at flow rates regulated by the mass flow controllers 188 and 191, respectively. Then, the oxygen gas and the nitrogen gas mix to produce an oxygen-containing gas. The oxygen gas supply pipe 180 carries the oxygen-containing gas into the ozone generator 42.

Figure 5A:
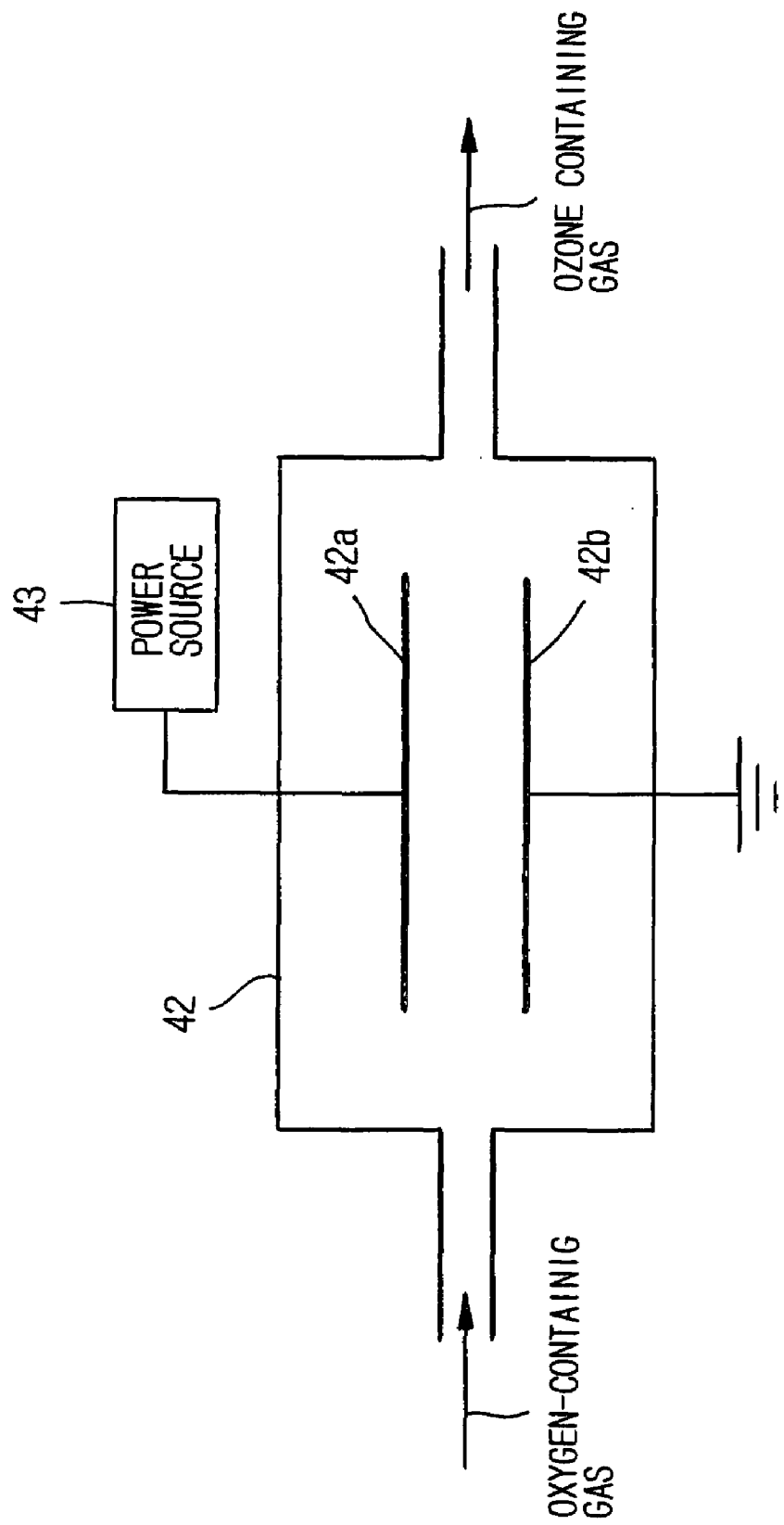
FIG. 5A schematically shows a structure of an ozone generator shown in FIG. 5.

Referring to FIG. 5A, the ozone generator 42 has discharge electrodes 42a, 42b between which the oxygen-containing gas passes. At least one of the discharge electrodes 42a and 42b is covered with a dielectric member, not shown. An ac power source 42c, typically a high-frequency power source, applies a voltage across the discharge electrodes 42a and 42b to produce a corona discharge, i.e., an electric discharge, between the discharge electrodes 42a and 42b. The oxygen-containing gas passing between the discharge electrodes 42a and 42b is subjected to the corona discharge, thereby part of oxygen molecules contained in the oxygen-containing gas are ionized to be converted into ozone. The ozone thus produced is discharged together with other gases (such as nitrogen and non-reacted oxygen), as an ozone-containing gas, from the ozone generator 42. The ac power source 42c includes a power regulator capable of varying the voltage applied across the discharge electrodes 42a and 42b to control the ozone concentration of the ozone-containing gas. Referring again to FIG. 5, the ozone-containing gas discharged from the ozone generator 42 can be supplied to the processing chambers 30A and 30B, through the ozone-containing gas supply pipe 60 and the ozone-containing gas supply branch pipes 61a and 61b, respectively.

A unit controlling CPU 200, which processes information on processes to be performed by the substrate processing units 23a and 23b, is capable of detecting the respective states of the flow regulating valves 52a and 52b, namely, whether or not each of the flow regulating valves 52a and 52b is opened. The unit controlling CPU 200 sends information on the processes to be performed by the substrate processing units 23a and 23b, and aforesaid information on the respective states of the flow regulating valves 52a and 52b to a CPU 201, i.e., a controller for controlling the mass flow controllers 188 and 191 and the ozone generator 42.

The CPU 201 determines a sum of the flow rates of the ozone-containing gas to be supplied into the processing vessels 30A and 30B on the basis of the information on the respective states of the flow regulating valves 52a and 52b given thereto by the unit controlling CPU 200. In other words, the CPU 201 determines the ozone-containing gas demand of processes to be performed in the processing vessels 30A and 30B. The CPU 201 controls the mass flow controllers 188 and 191 to supply oxygen gas and nitrogen gas to the ozone generator 42 at a supply rate (flow rate) that enables the ozone generator 42 to discharge the ozone-containing gas at an discharging rate (flow rate) that complies with or coincides with the aforementioned sum of the flow rates of the ozone-containing gas to be supplied into the processing vessels 30A and 30B. The CPU 201 controls the mass-flow controllers 188 and 191 so that nitrogen-oxygen ratio of the oxygen-containing gas supplied to the ozone generator 42 is kept substantially constant regardless of the flow rate of the oxygen-containing gas supplied to the ozone generator 42.

If only one of the processing vessels 30A and 30B needs the ozone-containing gas, the ozone generator 42 produces the ozone-containing gas at a rate of, for example, about 4 l/min.

When both the processing vessels 30A and 30B need the ozone-containing gas, the ozone generator 42 produces the ozone-containing gas at a rate of, for example about 8 l/min. In this case, since the flow regulating characteristics of the flow regulating valves 52a and 52b are adjusted beforehand, the ozone-containing gas is supplied at equal flow rates, such as about 4 l/min, to the processing vessels 30A and 30B, respectively.

In the above explanation, the CPU 201 determines the ozone-containing gas demand based on the conditions of the flow regulating valves 52a and 52b. Alternatively, the CPU 201 may determine the ozone-containing gas demand with reference to the process recipe defining the time sequence of the processes to be performed by the processing units and pre-installed in a system controller (not shown) that controls the CPU 200 and the CPU 201.

The CPU 201 is capable of detecting an ozone concentration measured by an ozone-concentration measuring device 165 and of controlling the discharge voltage of the ozone generator 42, in other words, the voltage applied across the electrodes 42a and 42b. The measured ozone concentration is used as a control signal for the feedback control of the discharge voltage of the ozone generator 42. Thus, the ozone concentration of the ozone-containing gas is controlled in a feedback control mode. Consequently, the ozone-containing gas having a stable ozone concentration can be produced by appropriately adjusting the discharge voltage, even if the flow rate of the oxygen-containing gas flowing into the ozone generator 42, the oxygen-nitrogen ratio of the oxygen-containing gas, or pressure in the ozone generator 42 is changed.

The ozone-containing gas of a desired pressure having a stable ozone concentration can be supplied at desired flow rates to the processing vessels 30A and 30B by the control operations of the CPU 201. Therefore, wafers W processed by supplying the ozone-containing gas only one of the processing vessels 30A and 30B, and those processed by supplying the ozone-containing gas simultaneously to both the processing vessels 30A and 30B can be subjected to the resist-solubilizing processes of the same process conditions.

In the illustrated embodiment, the processing system has two separated CPU's 200 and 201, however, these CPU's may be integrated into a single processing unit.

Figure 6:
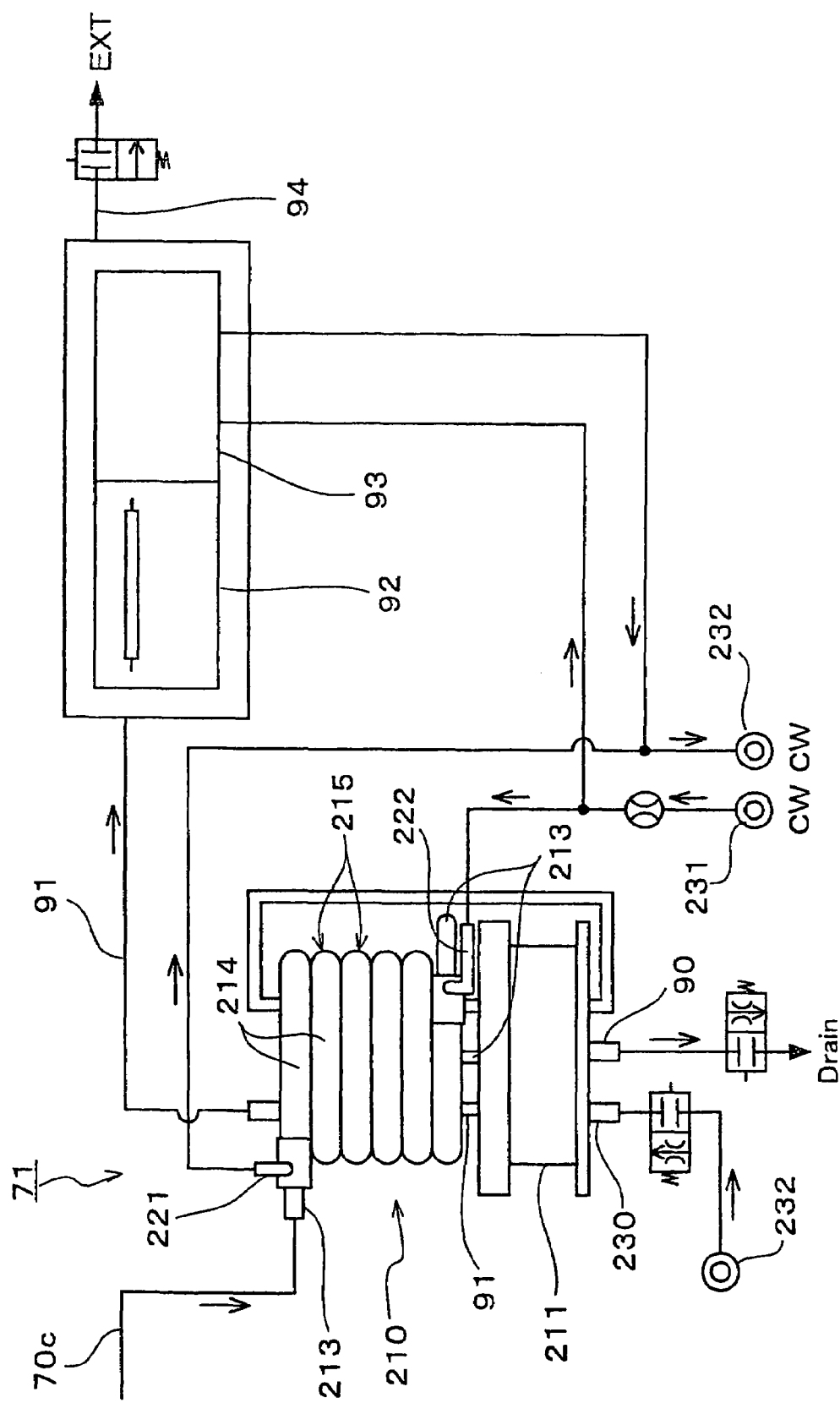
FIG. 6 is a piping diagram of a piping system relating to a mist trap shown in FIG. 3.
Figure 7:
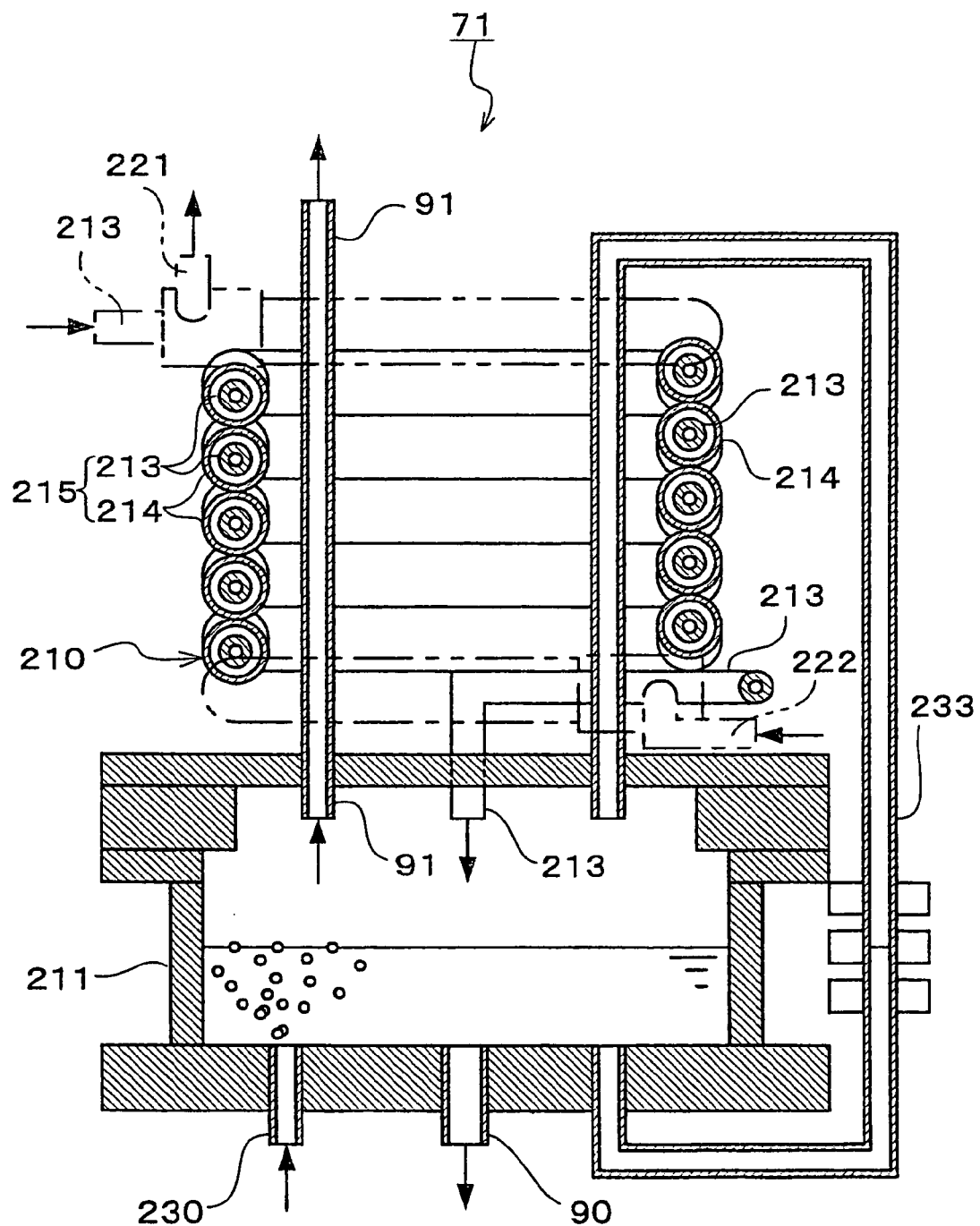
FIG. 7 is a cross-sectional view of the mist trap shown in FIG. 6.

Referring to FIGS. 6 and 7, the mist trap 71 has a cooling unit 210 for cooling a discharge fluid discharged from the processing vessels 30A and 30B and containing steam and the ozone-containing gas, and a tank 211 for storing liquefied ozone-containing water produced by cooling the discharge fluid by the cooling unit 210.

The cooling unit 210 has a cooling coil formed by coiling a double pipe 215 consisting of an inner pipe 213 and an outer pipe 214 surrounding the inner pipe 213 in, for example, six coils. Cooling water is passed through an annular space between the inner pipe 213 and the outer pipe 314 to cool the discharge fluid flowing through the inner pipe 213. An upper end part of the inner pipe 213 projecting from the upper end of the coiled double pipe 215 is connected to the discharge pipe 70c. A cooling water discharge pipe 221 is connected to the upper end, from which the upper end part of the inner pipe 213 projects from the double pipe 215, of the outer pipe 214 of the double pipe 215. Cooling water flows upward through the annular space and is discharged through the cooling water discharge pipe 221. A lower end part of the inner pipe 213 projecting from the lower end of the coiled double pipe 215 is extended through the top wall of the tank 211 into the tank 211. A cooling water supply pipe 222 is connected to the lower end, from which the lower end part of the inner pipe 213 projects from the double pipe 215, of the outer pipe 214. Cooling water is supplied into the annular space between the inner pipe 213 and the outer pipe 214 through the cooling water supply pipe 222.

The cooling water discharge pipe 221 and the cooling water supply pipe 222 are connected to a cooling water recovery means 232 and a cooling water supply means 231, respectively, as shown in FIG. 6. Cooling water flows through the annular space between the inner pipe 213 and the outer pipe 214. The cooling water supply means 231 and the cooling water recovery means 232 are connected to a cooling device 93 to circulate cooling water through the cooling unit 93.

The discharged processing fluid containing the ozone-containing gas, steam and nitrogen gas, and discharged through the discharge pipe 70c, flows through the inner pipe 213, and is cooled by cooling water flowing through the annular space between the inner and outer pipes 213 and 214. Consequently, steam contained in the discharged processing fluid condenses into water. Thus, the discharged processing fluid is reduced into water and the ozone-containing gas containing oxygen gas, nitrogen gas and ozone. Actually, the discharged processing fluid is reduced into ozone-containing water and an ozone-containing gas by cooling because part of ozone dissolves in pure water produced by the transformation of steam.

The lower end part of the inner pipe 213 and the discharge pipe 91 are extended through the top wall of the tank 211 into the tank 211. The drain pipe 90 and a gas supply port 230 are extended through the bottom wall of the tank 211. A gas source 232 is connected to the gas supply port 230. A level indicator 233 connected to the tank 211 indicates liquid level in the tank 211. The discharge pipe 91 is extended upward through a space surrounded by the coils of the double pipe 215, is projected upward from the cooling unit 210 and is connected to the ozone killer 92.

The inner pipe 213 delivers the ozone-containing water and the ozone-containing gas into the tank 211. The ozone-containing gas filling an upper space in the tank 211 is discharged from the tank 211 through the discharge pipe 91 to the ozone killer 92. A gas, such as air, is introduced into the ozone-containing water stored in a lower space of the tank 211 through the gas supply port 230 to remove ozone from the ozone-containing water by bubbling. Bubbling can reduce the ozone concentration of the ozone-containing water from about 15 ppm to a value not higher than an effluent standard ozone concentration of 5 ppm. The ozone-containing water is drained through the drain pipe 90 after thus reducing the ozone concentration of the ozone-containing water below the effluent standard ozone concentration. This ozone concentration reducing method is capable of reducing the harmfulness of effluents at a running cost lower than that is necessary for reducing the ozone concentration of the ozone-containing water by a method that dilutes the ozone-containing water with pure water or uses an ozone decomposing chemical.

A processing method of processing a wafer W by the aforementioned substrate processing system 1 will be described.

The wafer transfer arm 11 takes out one wafer W at a time from the wafer carrier C placed on the table 6 of the in/out port 4 and carries the wafer W to the wafer delivery unit 17. Then, the main wafer conveyer 18 receives the wafer W from the wafer delivery unit 17. The main wafer conveyer 18 carries the wafers W one by one successively to the substrate processing units 23a to 23f. The substrate processing units 23a to 23f subject the wafers W to the resist-solubilizing process to make the resist films formed on the wafers W water-soluble. Then, the carrying arm 18a carries out the wafers W successively from the substrate processing units 23a to 23f, and delivers the wafers W to the substrate cleaning units 12 to 15. Then, the substrate cleaning units 12 to 15 subject the wafers W to the cleaning process to remove the water-soluble resist films from the wafers W, subject the wafers W, when necessary, to a metal removing process to remove particles from the wafers W with a chemical liquid, and subject the cleaned wafers W to the drying process. Then, the carrying arm 18a carries the dried wafers W to the wafer delivery unit 17. The wafer transfer arm 11 transfers the thus cleaned wafers W from the wafer delivery unit 17 to the wafer carrier C.

The operation of the substrate processing unit 23a (i.e., the processes to be performed by unit 23a) will be described as a representative example of those of the substrate processing units 23a to 23f.

At first, a wafer loading process is performed. Referring to FIG. 4, the cover 101 is separated from the vessel body 100. The carrying arm 18a, holding a wafer W, of the main wafer conveyer 18 is moved to a position under the body 101a of the cover 101. The holding members 112 of the cover 101 receive the wafer W from the carrying arm 18a. Then, the cylinder lifting mechanism, not shown, lowers the cover 101 toward the vessel body 100 to advance the holding members 112 into the annular groove 100c of the vessel body 100 and to place the wafer W on the support members 111 arranged on the circular land 110 of the vessel body 100. The gap G is formed between the lower surface of the wafer W supported on the support members, and the upper surface of the circular land 110. The cover 101 is lowered further after the wafer W has been supported on the support members 111. The cover 101 is joined to the upper surface of the circumferential wall 100b of the vessel body 100 so as to compress the O-rings 115a and 115b to seal the processing vessel 30A. Thus, the loading of the wafer W into the processing vessel 30A is completed.

After the completion of the wafer loading process, a heating process is performed. The heaters 105 and 125 are energized to heat the interior of the processing vessel 30A and the wafer W. The heating process promotes the effect of a resist-solubilizing process.

After the completion of the heating process, an ozone-containing gas filling process is performed. After the interior of the processing vessel 30A and the wafer W have been heated at a predetermined temperature, the unit controlling CPU 200 gives a signal, representing that the interior of the processing vessel 30A and the wafer W have been heated at the predetermined temperature, to the CPU 201. Then, the CPU 201 decides to start supplying an ozone-containing gas into the processing vessel 30A. The unit controlling CPU 200 gives a control signal to the flow regulating valve 52a to open the flow regulating valve 52a. Then, an ozone-containing gas having a predetermined ozone concentration is supplied from the ozone generator 42 through the ozone-containing gas supply main pipe 60, the ozone-containing gas supply branch pipes 61a, the flow regulating valve 52a and the main supply pipe 38a into the processing vessel 30A at a flow rate according to the opening of the variable throttle of the flow regulating valve 52a adjusted beforehand. As previously mentioned, the openings of the variable throttles of the flow regulating valves 52a and 52b are adjusted beforehand so that the ozone-containing gas is supplied into both the processing vessels 30A and 30b at equal flow rates when both the flow regulating valves 52a and 52b are opened.

The first switch valve 81 of the discharge selector 72 is opened and regulates the flow of the processing fluid discharged from the processing vessel 30A so that the discharged processing fluid flows at a predetermined flow rate through the discharge pipe 70a. Thus, the ozone-containing gas is supplied into the processing vessel 30A while the processing fluid is thus discharged through the discharge pipe 70a to create an ozone-containing gas atmosphere of a fixed pressure in the processing vessel 30A. The internal pressure of the processing vessel 30A is kept at a positive pressure higher than the atmospheric pressure by, for example, a gage pressure of about 0.2 MPa. The heaters 105 and 125 keep heating the internal temperature of the processing vessel 30A and the wafer W at the predetermined temperature. The processing fluid is discharged from the processing vessel 30A through the discharge pipe 70a into the mist trap 71. Thus, the processing vessel 30A is filled with the ozone-containing gas having the predetermined ozone concentration.

The CPU 201 controls the mass flow controllers 188 and 191 and the ozone generator 42 to control the flow rate and the ozone concentration of the ozone-containing gas being supplied to the processing vessel 30A. The CPU 201 controls the mass flow controllers 188 and 191 on the basis of the respective conditions of the flow regulating valves 52a and 52b (opened or closed) represented by signals provided by the unit controlling CPU 200 to control the flow rate of the oxygen-containing gas flowing into the ozone generator 42, and thereby the flow rate of the ozone-containing gas produced by the ozone generator 42 and discharged therefrom is controlled.

A feedback control system including the CPU 201, the ozone generator 42 and the ozone-concentration measuring device 165 controls the ozone concentration of the ozone-containing gas by a feedback control mode. The ozone-containing gas flows through the flow regulating valve 52a, being opened, and the ozone-containing gas supply branch pipes 61a into the processing vessel 30A. Since the flow regulating valve 52b is closed, the ozone-containing gas is unable to flow through the ozone-containing gas supply branch pipes 61b into the processing chamber 30B. The ozone-containing gas having the desired ozone concentration is supplied at a desired flow rate of, for example, 4 l/min, into the processing vessel 30A irrespective of the condition of the processing vessel 30B.

After the completion of the ozone-containing gas filling process, a resist-solubilizing process is performed. Steam is supplied into the processing vessel 30A together with the ozone-containing gas. Steam and the ozone-containing gas are supplied simultaneously into the processing vessel 30A with the first switch valve 81 of the discharge selector 72 opened to discharge the processing fluid from the processing vessel 30A. The temperature of steam generated by the steam generator 40 and flowing through the main supply pipe 38a is regulated at, for example about 115° C. The steam and the ozone-containing gas are mixed at the supply selector 41a to produce a processing fluid, and the processing fluid is supplied into the processing vessel 30A. The internal pressure of the processing vessel 30A is still kept at a positive pressure higher than the atmospheric pressure by, for example, a gage pressure of about 0.2 MPa. The heaters 105 and 125 keep heating the internal temperature of the processing vessel 30A and the wafer W at the predetermined temperature. The processing fluid oxidizes the resist film formed on the surface of the wafer W for the resist-slubilizing process.

During the resist-solubilizing process, the ozone-containing gas is supplied through the main supply pipe 38a at the flow rate determined by the opening of the variable throttle the flow regulating valve 52a adjusted beforehand, and steam is supplied through the main supply pipe 38a at the flow rate determined by the opening of the variable throttle of the flow regulating valve 50*a* adjusted beforehand. The first switch valve 81 of the discharge selector 72 is opened to control the flow rate of the discharged processing fluid discharged from the processing vessel 30A and flowing through the discharge pipe 70*a* by the first switch valve 81. Thus, the ozone-containing gas and steam are supplied respectively at the predetermined flow rates into the processing vessel 30A while the processing fluid is thus discharged through the discharge pipe 70*a* to create a processing fluid atmosphere of a fixed pressure containing steam and the ozone-containing gas in the processing vessel 30A.

During the resist-solubilizing process is performed, the processing fluid is continuously supplied through the main supply pipe 38*a* into the processing vessel 30A, and the processing fluid is continuously discharged from the processing vessel 30A through the discharge pipe 70*a*. The processing fluid flows along the upper and the lower surface (gap G) of the wafer W toward the discharge port 121 connected to the discharge pipe 70*a*. At least part of the time period of the resist-solubilizing process, the supply of the processing fluid through the main supply pipe 83*a* and the discharge of the processing fluid through the discharge pipe 70*a* may be stopped during the resist-solubilizing process to process the resist film by the processing fluid held in the processing vessel 30A.

During the resist-solubilizing process, the CPU 201 also controls the mass flow controllers 188 and 191 and the ozone generator 42 to control the flow rate and the ozone concentration of the ozone-containing gas to be supplied into the processing vessel 30A. Consequently, the ozone-containing gas having the desired ozone concentration is supplied at the desired flow rate into the processing vessel 30A irrespective of the operating condition of the processing vessel 30B. Supply of the ozone-containing gas at the fixed flow rate keeps the internal pressure of the processing vessel 30A constant. Thus, the internal pressure of the processing vessel 30A, the flow of the processing fluid around the wafer W and the ozone concentration of the processing fluid can be kept at the desired values, respectively, irrespective of the operating condition of the processing vessel 30B. Wafers W simultaneously subjected to the resist-solubilizing process by the processing vessels 30A and 30B, and wafers W processed by the resist-solubilizing process in a processing mode in which the processing vessel 30A (or 30B) performs the resist-solubilizing process while the processing vessel 30B (or 30A) performs the wafer loading process are processed equally by the resist-solubilizing process.

After the completion of the resist-solubilizing process, the purging process is performed. The flow regulating valves 50*a* and 52*b* are closed, the stop valve 54*a* is opened, the flow selector valve 68 is set to the high-flow position to supply nitrogen gas at a high flow rate from the nitrogen gas source 43 into the processing vessel 30A, and the second discharge regulating valve 82 of the discharge selector 72 connected to the discharge pipe 70*a* is opened. Thus, nitrogen gas is supplied from the nitrogen gas source into the processing chamber 30A while the processing fluid is thus discharged from the processing vessel 30A to purge the main supply pipe 38*a*, the processing vessel 30A and the discharge pipe 70*a* by the nitrogen gas. The discharged processing fluid is carried by the discharge pipe 70*a* into the mist trap 71. Thus, the processing fluid containing the ozone-containing gas and steam is discharged from the processing vessel 30A.

After the completion of the purging process, a wafer unloading process is performed. The cover lifting mechanism is actuated to raise the cover 101 so as to separate the cover 101 from the vessel body 100 and to transfer the wafer W from the support members 111 of the vessel body 100 to the diametrically opposite holding members 112 of the cover 101. Then, the carrying arm 18*a* of the main conveyer 18 advances into a space under the body 101*a* of the cover 101, receives the wafer W from the holding members 112 of the cover 101, and carries the wafer W out of the processing vessel 30A.

There is a case where the substrate processing unit 23*b* performs the ozone-containing gas supplying process or the resist-solubilizing process that needs the ozone-containing gas while the substrate processing unit 23*a* performs the ozone-containing gas supplying process or the resist-solubilizing process, and a case where the substrate processing unit 23*b* performs the ozone-containing gas supplying process of the resist-solubilizing process while the substrate processing unit 23*a* performs the wafer loading process, the processing fluid discharging process or the wafer unloading process that does not need the ozone-containing gas. In the former case, the ozone-containing gas is supplied simultaneously to both the processing vessels 30A and 30B. In the latter case, the ozone-containing gas is supplied only to the processing vessel 30A or the processing vessel 30B.

In a case where the substrate processing unit 23*b* performs the wafer loading process while the substrate processing unit 23*a* performs the ozone-containing gas supplying process to supply the ozone-containing gas into the processing vessel 30A, the flow regulating valve 52*a* is opened and the flow regulating valve 52*b* is closed, and the ozone generator 42 produces the ozone-containing gas at a rate sufficient for supplying the ozone-containing gas only to the processing vessel 30A. The ozone-containing gas flows through the ozone-containing gas supply branch pipe 61*a* at a flow rate on the order of 4 l/min, and flows through the main supply pipe 38*a* into the processing vessel 30A.

In a case where the substrate processing unit 23*b* starts the ozone-containing gas supplying process while the substrate processing unit 23*a* is performing the resist-solubilizing process and the ozone-containing gas and steam is supplied into the processing vessel 30A, the flow regulating valve 52*b* is opened, the unit controlling CPU 200 gives a signal indicating that both the flow regulating valves 52*a* and 52*b* are open to the CPU 201, and the CPU 201 controls the mass flow controllers 188 and 191 to supply the oxygen-containing gas to the ozone generator 42 at a flow rate twice the flow rate at which the oxygen-containing gas is supplied to the ozone generator 42 when the ozone-containing gas needs to be supplied only to the processing vessel 30A or the processing vessel 30B. Then, the ozone-containing gas flows through the main supply pipe 60 at a flow rate on the order of 8 l/min and through each of the ozone-containing gas supply branch pipes 61*a* and 61*b* at a flow rate on the order of 4 l/min because both the flow regulating valves 52*a* and 52*b* are open, and is supplied through the main supply pipes 38*a* and 38*b* at the same flow rates into the processing vessels 30A and 30B. Thus, an ozone-containing gas supply mode for supplying the ozone-containing gas only to the processing vessel 30A for an ozone-containing gas supply mode for supplying the ozone-containing gas to both the processing vessels 30A and 30B.

When the substrate processing unit 23*a* starts the processing fluid discharging process after the completion of the resist-solubilizing process, the flow regulating valve 52*a* is closed and the unit controlling CPU 200 gives a signal to the CPU 201 to the effect that flow regulating valve 52*a* has been closed. Then, the CPU 201 controls the mass flow controllers 188 and 191 so that the flow rate of the oxygen-containing gas for supplying the oxygen-containing gas necessary for supplying the ozone-containing gas to the two processing vessels 30A and 30B is reduced by half. The ozone-containing gas flows through the main supply pipe 60 at a flow rate on the order of 4 l/min, and flows only through the ozone-containing gas supply branch pipe 61b at a flow rate on the order of 4 l/min because the flow regulating valve 52a is closed. The ozone-containing gas flows through the main supply pipe 38b into the processing vessel 30B. Thus, the ozone-containing gas is supplied only to the processing vessel 30B.

An ozone-containing gas having a predetermined ozone concentration can be produced even if the flow rate of the oxygen-containing gas is changed or the oxygen concentration of the ozone-containing gas is changed because the ozone-concentration measuring device 165 measures the ozone concentration and the CPU 201 controls the discharge voltage of the ozone generator 42 according to the measured ozone concentration.

As mentioned above, the ozone-containing gas having the desired ozone concentration can be supplied at the desired flow rate into the processing vessels 30A and 30B, regardless of the number (one or two) of the processing vessels 30A and 30B being supplied with the ozone-containing gas.

The substrate processing system 1 is able to generate the ozone-containing gas having a stable ozone concentration according to the demands of the processing vessels 30A and 30B for the ozone-containing gas. Since the pressure of the ozone-containing gas in the processing vessels 30A and 30B, flow rates at which the ozone-containing gas is supplied to the processing vessels 30A and 30B, and the ozone concentration of the ozone-containing gas are stabilized, the uniformity of the effect of the resist-solubilizing process in the processing vessels 30A and 30B is improved, and thereby the uniformity and reliability of the effect of the subsequent cleaning process to be carried out by the substrate cleaning units 12 to 15 to remove the resist films, and the uniformity of the effect and the reliability of an etching process including the processes to be carried out by the substrate processing system are improved.

Although the invention has been described in its preferred embodiment as applied to processing semiconductor wafers, substrates that can be processed by the present invention is not limited thereto; the present invention is applicable to processing substrates including glass substrates for LCDs, printed circuit boards, ceramic substrates and the like.

The oxygen-containing gas is not limited to a mixed gas of oxygen gas and nitrogen gas, but may be any suitable mixed gas provided that the mixed gas contains oxygen gas. For example, the oxygen-containing gas may be a mixture of oxygen gas and air.

The control means for controlling the discharge voltage of the ozone generator 42 is not limited to the feedback control system including the CPU 201, the ozone generator 42 and the ozone-concentration measuring device 165. For example, when the flow rate of the oxygen-containing gas is changed suddenly and if the ozone concentration varies in a wide range or the stabilization of the ozone concentration takes time, operations for changing the flow control setting of the mass flow controllers 188 and 191, opening or closing the flow regulating valves 52a and 52b, and changing the discharge voltage may be timed so as to perform those operations at different times so that the ozone concentration may not vary in a wide range.

The steam distribution ratio, i.e., the ratio of the units of steam generated by the steam generator per unit time to the units of steam supplied per unit time to the processing vessel 30A or the processing vessel 30B, is not limited to five-to-two. For example, if steam generated by the steam generator 40 needs to be distributed to three of more processing vessels, the steam generating rate of the steam generator 40 is increased according to the number of processing vessels demanding steam and the steam may be distributed at a proper distribution ratio to the processing vessels.

Although two processing vessels (30A, 30B) of two substrate processing unit (23a, 23b) is connected to single ozone generator 42 in this embodiment, three or more processing chambers of three or more processing units may be connected to single ozone generator 42.

Figure 8:
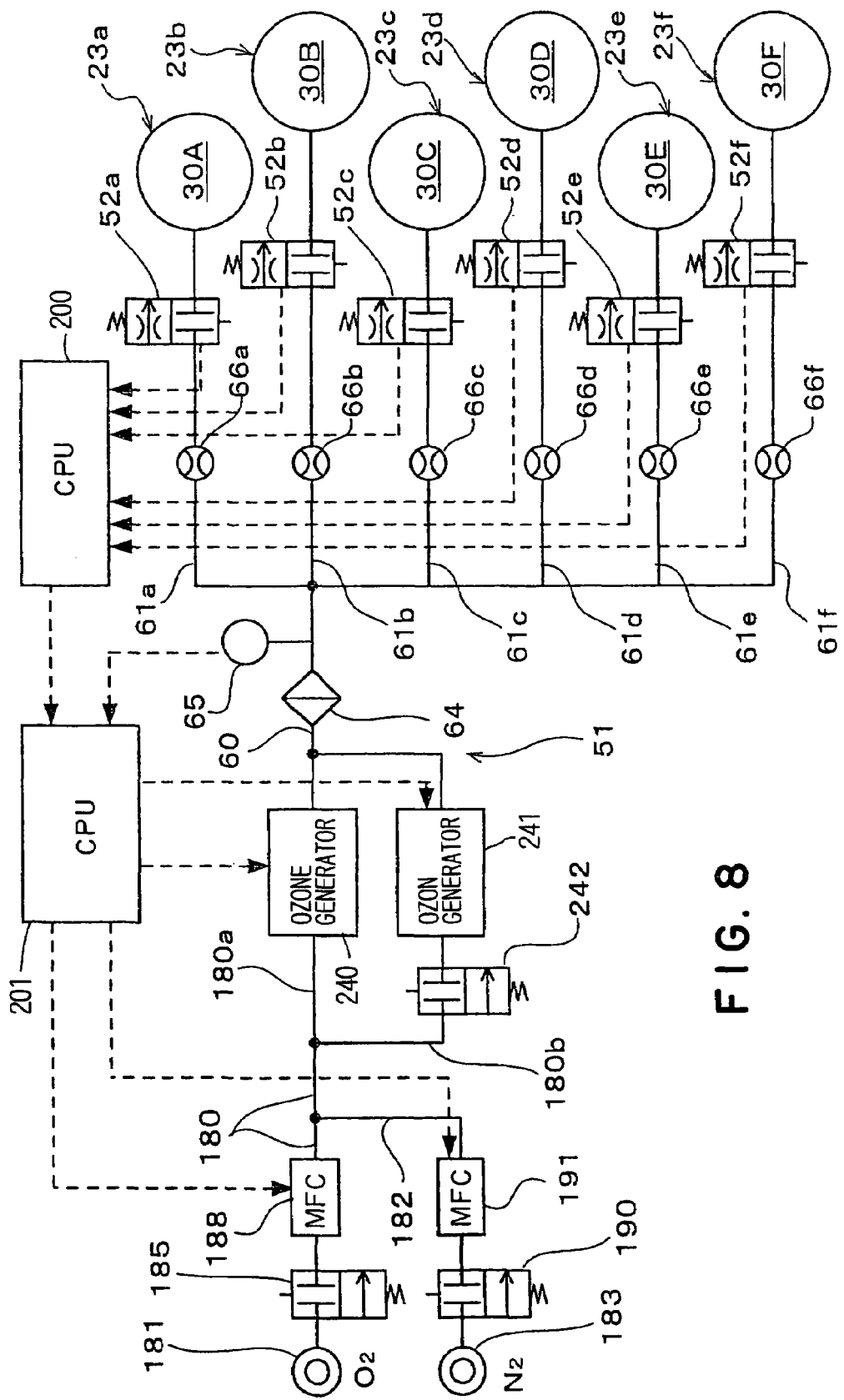
FIG. 8 is a piping diagram of a piping system, provided with an additional ozone generator and additional processing vessels, modified based on the system shown in FIG. 5.

In the event that a large number of the processing vessels are connected to a common ozone supply means, the processing system may be constituted as including one or more additional ozone generator. FIG. 8 shows another embodiment of the present invention. In the system shown FIG. 8, there are provided two ozone generators 240 and 241, and only one (240) of the ozone generators or both the ozone generators are used for supplying the ozone-containing gas, depending on the number of the processing vessels 30A to 30F demanding the ozone-containing gas.

As is similar to FIG. 5, FIG. 8 shows a piping diagram of a piping system relating to the ozone supply, which is extracted from the entire piping system of the processing system for the purpose of detailed explanation. The members in FIG. 8 designated by the reference numerals, which are the same as or similar to those shown in FIG. 5, are the same or similar to the members shown in FIG. 5. Of course, the processing system having the piping system of FIG. 8 has a steam supply system and the processing fluid discharge system similar to those shown in FIG. 3, however, being modified according to the change in the number of the processing vessels.

In the substrate processing system of FIG. 8, two branch pipes 180a and 180b branched off from the downstream end of the oxygen gas supply pipe 180 are connected to the ozone generators 240 and 241, respectively. The branch pipe 180b is provided with a stop valve 242. Each of the ozone generators 240 and 421 has an ozone generating capacity capable of simultaneously supplying the ozone-containing gas to the three processing vessels.

An ozone-containing gas supply passage means 51 includes an ozone-containing gas supply main pipe 60, and ozone-containing gas supply branch pipes 61a, 61b, 61c, 61d, 61e and 61f branched from the main pipe 60. The upstream end of the main pipe 60 is branched into two branch pipes, which are connected to the ozone generators 240 and 241, respectively. The ozone-containing gas supply branch pipes 61 are provided with flowmeters 66a to 66f, flow regulating valves 52a to 52f for regulating the flow rates of the ozone-containing gas flowing into processing vessels 30A to 30F, respectively. The flowmeters 66a to 66f and the flow regulating valves 52a to 52f are arranged in that order from the side of the ozone generators 240 and 241. The flow regulating characteristics of the flow regulating valves 52 to 52f are adjusted beforehand such that, when two or more than two of the flow regulating valves 52a to 52f are opened, the flow rates measured by the flowmeters (66a to 66f) corresponding to the opened flow regulating valves are equal.

The ozone-containing gas supply branch pipes 61a to 61f are connected to main supply pipes 38a to 38f, at the supply selectors (which are of the same structure as the supply selectors 41a and 41b shown in FIG. 3, however, are not shown in FIG. 8) respectively including the flow regulating valves 52 to 52f, so that the ozone-containing gas can be supplied into the processing vessels 30A to 30F solely or together with water vapor.

A CPU 201, similarly to the case where the CPU 201 controls the single ozone generator 42, controls the discharge voltages of the ozone generators 240 and 241 on the basis of a measured ozone concentration measured by the ozone-concentration measuring device 65. The CPU 201 controls the set position of the stop valve 242, and the operation of the additional ozone generator 241 according to the number of the processing vessels needing the supply of the ozone-containing gas. When the ozone-containing gas needs to be supplied to the three or less processing vessels, stop valve 242 is closed, the ozone generator 241 is stopped, and only the ozone generator 240 is operated.

When the ozone-containing gas needs to be supplied to the four or more processing vessels, the stop valve 242 is opened and both the ozone generators 240 and 241 are operated for ozone generation. Thus, only the ozone generator 240 or both the ozone generators 240 and 241 are used selectively depending on the number of the processing vessels needing the ozone-containing gas. Thus the ozone-containing gas can be produced at a sufficiently high production rate even if the ozone-containing gas demand of the processing vessels exceeds the ozone-containing gas producing capacity of one of the ozone generators 240 and 241.

Figure 9:
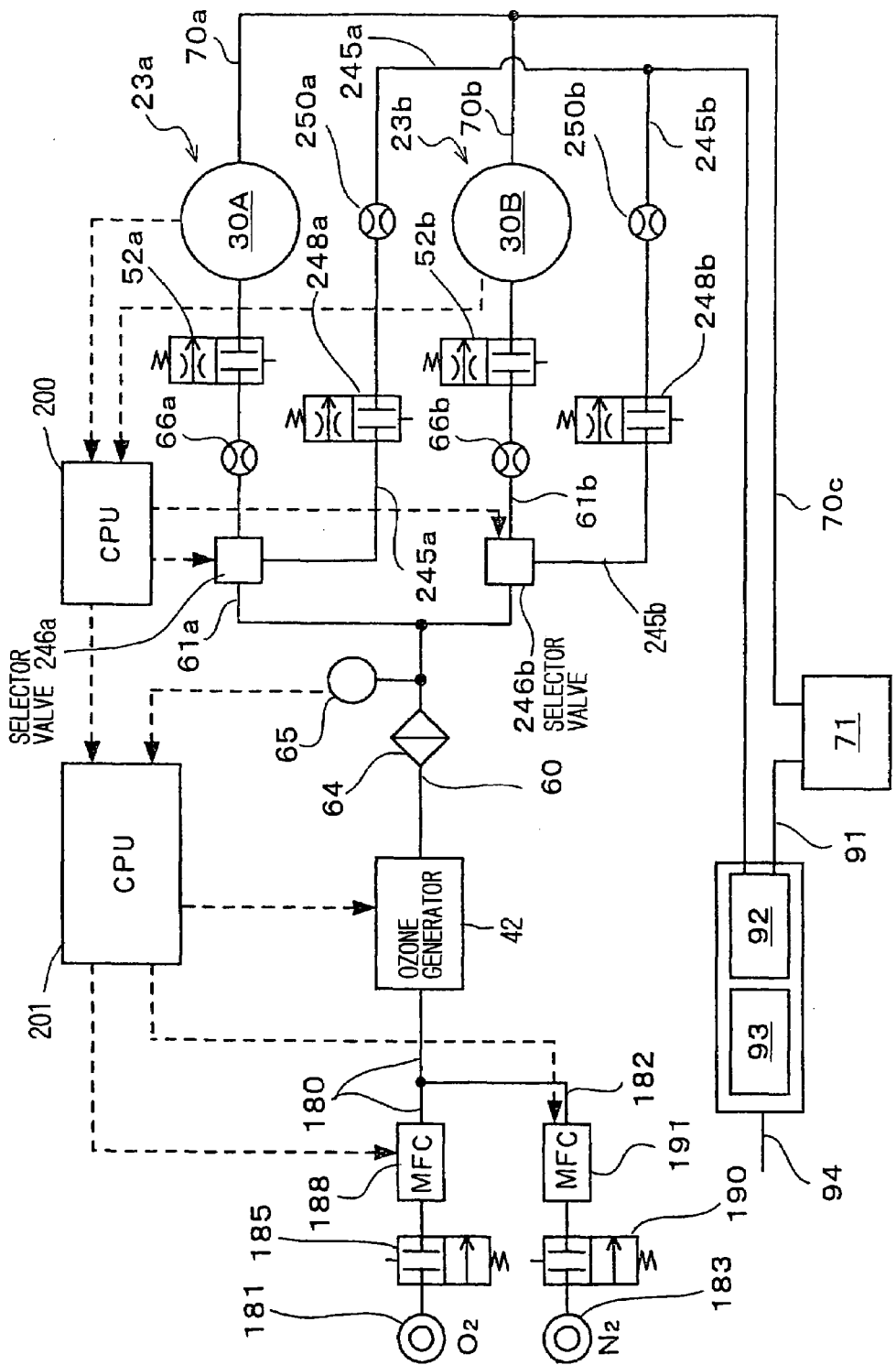
FIG. 9 is a piping diagram of a piping system, provided with blow-off lines, modified based on the system shown in FIG. 5.

FIG. 9 shows another embodiment of the present invention. As is similar to FIG. 5, FIG. 9 shows a piping diagram of a piping system relating to the ozone supply, which is extracted from the entire piping system of the processing system for the purpose of detailed explanation. The members in FIG. 9 designated by the reference numerals, which are the same as or similar to those shown in FIG. 5, are the same or similar to the members shown in FIG. 5. Of course, the processing system having the piping system of FIG. 9 has a steam supply system and the processing fluid discharge system similar to those shown in FIG. 3. However, the discharge system is modified according to the provision of the blow-off lines, mentioned below. The discharge system has discharge selectors (72, see FIG. 3), which are not shown in FIG. 9.

Referring to FIG. 9, the substrate processing system is provided with blow-off pipes 245a and 245b for discharging part of an ozone-containing gas produced by an ozone generator 42 without supplying that part to processing vessels 30A and 30B to supply ozone-containing gases respectively having a desired ozone concentrations at desired flow rates to the processing vessels 30A and 30B depending on processes being performed in the processing vessels 30A and 30B. The blow-off pipe 245a is connected to a selector valve 246a connected to an ozone-containing gas supply branch pipe 61a. The blow-off pipe 245b is connected to a selector valve 246b connected to an ozone-containing gas supply branch pipe 61b.

A unit controlling CPU 200 controls each of the selector valves 246a and 246b to set a state where the blow-off pipe 245a (or 245b) is disconnected from the corresponding ozone gas supply branch pipe 61a (or 61b) to supply the ozone-containing gas to the corresponding processing chamber 30A (or 30B), or to set a state where the blow-off pipe 245a (or 245b) is connected to the corresponding ozone-containing gas supply branch pipe 61a (or 61b) to discharge the ozone-containing gas therefrom so that the ozone-containing gas is not supplied to the corresponding processing chamber 30A (or 30B).

The blow-off pipes 245a and 245b are provided with flow regulating valves 248a and 248b, and flowmeters 250a and 250b, respectively. The downstream ends of the blow-off pipes 245a and 245b are connected to a pipe connected to an ozone killer 92. Preferably, the blow-off pipes 245a and 245b are formed of a fluorocarbon resin.

In the system shown in FIG. 9, the mass-flow controllers 188 and 191 keep the flow rates of oxygen gas and nitrogen gas being supplied to the ozone generator 42 constant regardless of the sorts of the processes being performed at the processing chambers. Thus, the ozone generator 42 discharges the ozone-containing gas at a fixed flow rate, for example 8 l/min.

The openings of the variable throttles included in the flow regulating valves 52a, 52b, 248a and 248b are adjusted beforehand so that: when the ozone-containing gas is supplied to both the processing vessels 30A and 30B, the ozone-containing gas is supplied to the processing vessels 30A and 30B at specific flow rates identical to each other, for example 4 l/min, respectively; and when the ozone-containing gas is supplied to one of the processing vessels (30A or 30B), the ozone-containing gas is supplied to said one of the processing vessels (30A or 30B) at said specific flow rate, for example 4 l/min, and is flown through the blow-off pipe (248b or 248a) corresponding to the other processing vessel (30B or 30A) at said specific flow rates, for example 4 l/min. The adjustment of the flow regulating valves 52a, 52b, 248a and 248b is performed based on the measurement of the flow rates by using the flowmeters 66a, 66b, 250a and 250b.

The flow regulating valves 52a, 52b, 248a and 248b are opened during a usual operation of the system. Thus, variable throttles without having shut-off function may be used instead of the flow regulating valves 52a, 52b, 248a and 248b.

The operation of the system shown in FIG. 9 is as follows.

The unit controlling CPU 200 controls the selector valves 246a and 246b according to the ozone-containing gas demand of processes performed in the processing vessels 30A and 30B.

When processes needing the ozone-containing gas are being carried out in both the processing vessels 30A and 30B, the selector valves 246a and 246b are opened to the ozone-containing gas supply branch pipes 61a and 61b. Due to the aforementioned adjustment of the flow regulating valves, the ozone-containing gas is supplied through the ozone-containing gas supply branch pipes 61a and 61b and the flow regulating valves 52a and 52b at said specific flow rates identical to each other into the processing vessels 30A and 30B, respectively.

If the processing vessel 30B is performing a process that does not need the ozone-containing gas, such as the wafer loading process, and the processing vessel 30A is performing a process that needs the ozone-containing gas, such as the ozone-containing gas supplying process, the selector valve 246a opens into the ozone-containing gas supply branch pipe 61a and the selector valve 246b is opened into the blow-off pipe 245b. Due to the aforementioned adjustment of the flow regulating valves, the ozone-containing gas flown into the ozone-containing gas supply branch pipe 61a is supplied into the processing vessel 30A at said specific flow rate, for example 4 l/min, and the ozone-containing gas ozone-containing gas supply branch pipe 61b is discharged therefrom through the blow-off pipe 245b at said specific flow rate, for example 4 l/min, and is not supplied to the processing chamber 30B. Thus, the ozone-containing gas is supplied at the desired flow rate into the processing vessel 30A whether or not the ozone-containing gas is supplied to the processing vessel 30B. The ozone-containing gas can be supplied only into the processing vessel 30B in the same manner as mentioned above in connection with the processing vessel 30A.

The ozone concentration of the ozone-containing gas is adjusted to a predetermined value by a feedback control system including the CPU 201, the ozone generator 42 and the ozone-concentration measuring device 165. Thus, the ozone-containing gas having the desired ozone concentration can always be supplied to the processing vessels 30A and 30B at the desired flow rate, such as 4 l/min.

According to the embodiment shown in FIG. 9, since the ozone generator 42 operates in a stable condition, the ozone-containing gas has a stable quality, resulting in the stable processing of the wafers W.

The flow rate of the ozone-containing gas may be controlled by using, in combination, the flow rate control method that controls the respective flow rates of oxygen gas and nitrogen gas, and the flow rate control method that controls the discharge of the ozone-containing gas through the blow-off pipes 245a and 245b.

Figure 10:
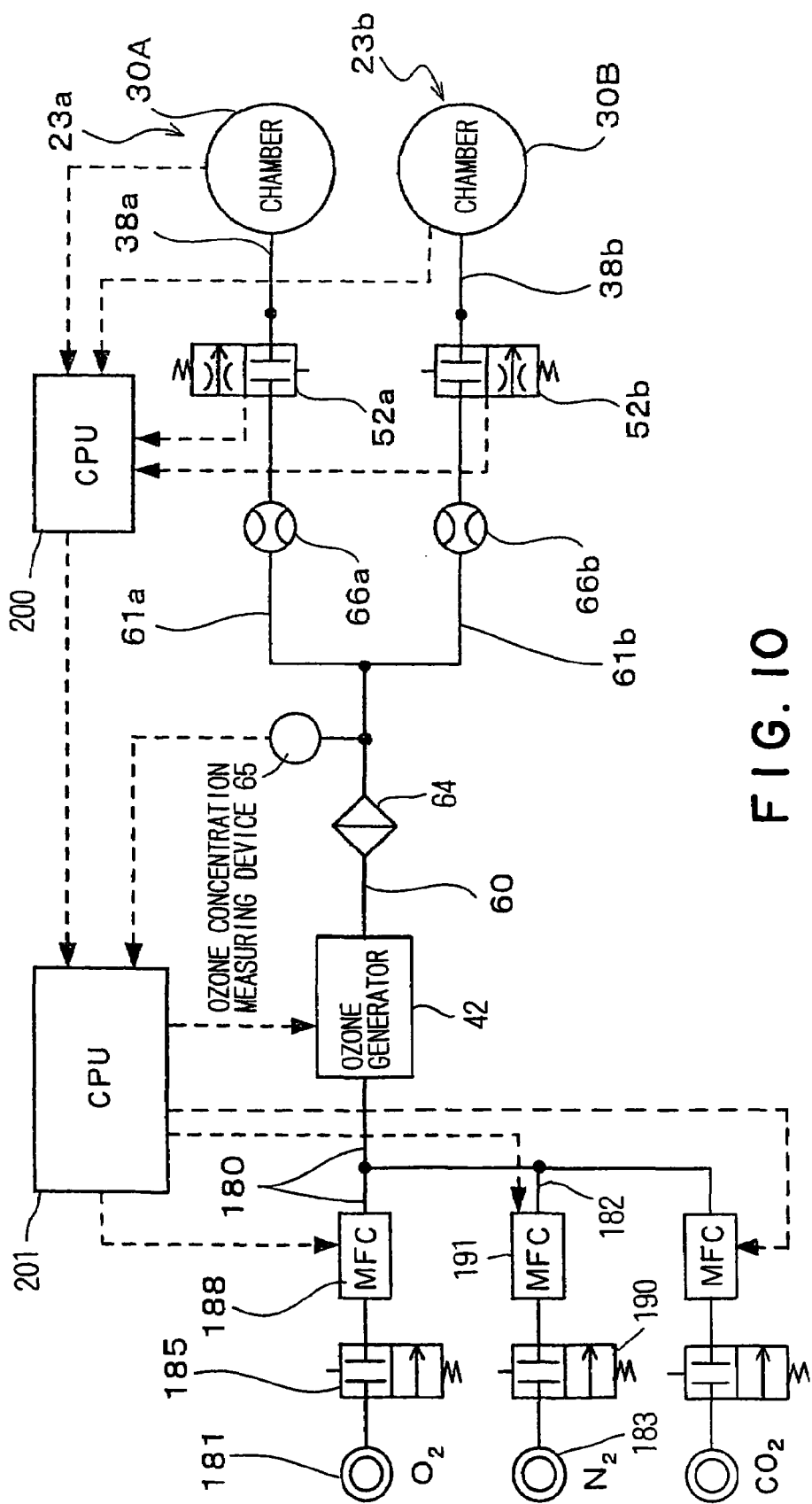
FIG. 10 is a piping diagram of a piping system, provided with a carbon dioxide gas supply, modified based on the system shown in FIG. 5.

Preferably, ozone-containing gas further includes carbon dioxide gas, and has a composition of about 0.008 vol % of nitrogen gas, and about 0.1 vol % of carbon dioxide gas, and the remainder being oxygen gas. In this case, the system shown in FIG. 5 is modified so that it further include a carbon dioxide gas source, a carbon dioxide gas supply pipe connected to the oxygen gas supply pipe 180, and a stop valve and a mass-flow controller placed in the carbon dioxide gas supply pipe, as shown in FIG. 10. The system shown in FIG. 8 may also include the carbon dioxide supply system as shown in FIG. 10.

As apparent from the foregoing description, the substrate processing system and the substrate processing method of the present invention are capable of producing an ozone-containing gas having a stable ozone concentration and of supplying the ozone-containing gas to the processing vessels at flow rates corresponding to the ozone-containing gas demands of the processes being carried out by the processing vessels. Consequently, the uniformity and reliability of effects of the resist removing process and the etching process are improved.

Although the invention has been described in its preferred embodiments with a certain degree of particularity, obviously many changes and variations are possible therein. It is therefore to be understood that the present invention may be practiced otherwise than as specifically described herein without departing from the scope and spirit hereof.

What is claimed is:

1. A substrate processing system comprising:
   an ozone generator provided with electrodes and configured to generate an ozone-containing gas by applying an electric discharge produced by the electrodes to an oxygen-containing gas supplied to the ozone generator;
   a plurality of processing chambers each adapted to process therein a substrate with the ozone-containing gas generated by the ozone generator;
   a plurality of ozone-containing gas supply lines connecting the ozone generator to each of the processing chambers;
   a flow regulator adapted to regulate a flow rate of the oxygen-containing gas supplied to the ozone generator; and
   a controller configured to determine demand for the ozone-containing gas based on a changed number of processing chambers processing with the ozone-containing gas, and configured to control the flow regulator to regulate a flow rate of the oxygen-containing gas being supplied to the ozone generator so that a generating rate of the ozone-containing gas being generated by the ozone generator and thus a flow rate of the ozone-containing gas being discharged from the ozone generator to be supplied to the processing chamber or chambers substantially correspond to the ozone-containing gas demand based on the changed number of processing chambers processing with the ozone-containing gas.

2. The substrate processing system according to claim 1 further comprising a plurality of variable throttles each provided in each of the ozone-containing gas supply lines to adjust an ozone-containing gas distribution ratio between the ozone-containing gas supply lines.

3. The substrate processing system according to claim 2 further comprising a plurality of flow measuring devices each provided respectively in the ozone-containing gas supply lines for measuring respective flow rates of the ozone-containing gas flowing into the processing chambers.

4. The substrate processing system according to claim 1, wherein, the oxygen-containing gas contains oxygen gas and nitrogen gas, and wherein the flow regulator includes an oxygen gas flow regulating device adapted to regulate a flow rate of the oxygen gas supplied to the ozone generator and a nitrogen gas flow regulating device adapted to regulate a flow rate of the nitrogen gas supplied to the ozone generator.

5. The substrate processing system according to claim 4, wherein the oxygen-containing gas further includes carbon dioxide gas, and wherein the flow regulator further includes a carbon dioxide gas flow regulating device adapted to regulate a flow rate of the carbon dioxide gas supplied to the ozone generator.

6. The substrate processing system according to claim 4, wherein the nitrogen gas flow regulating device is configured to regulate the flow rate of the nitrogen gas supplied to the ozone generator so that the ratio of the nitrogen gas supplied to the ozone generator to the oxygen gas supplied to the ozone generator is kept constant regardless of a flow rate of the ozone-containing gas discharged from the ozone generator.

7. The substrate processing system according to claim 1, further comprising:
   a power regulator adapted to regulate a voltage applied across the electrodes of the ozone generator; and
   an ozone concentration measuring device that measures an ozone concentration of the ozone-containing gas generated by the ozone generator,
   wherein the controller is also configured to control the power regulator to regulate the voltage being applied across the electrodes so that an ozone concentration of the ozone-containing gas being measured by the measuring device coincides with a target value.

8. The substrate processing system according to claim 1 further comprising:
   a steam generator adapted to generate a water vapor; and
   a plurality of steam supply lines each adapted to supply the water vapor to each of the processing chambers via each of the ozone-containing gas supply lines.

9. The substrate processing system according to claim 8 further comprising:
   a steam discharge line connected to the steam generator and adapted to discharge therethrough a part of the water vapor generated by the steam generator without supplying it to the processing chambers; and
   a flow control device provided in the steam discharge line to regulate a flow rate of the water vapor discharged through the steam discharge line, wherein the controller is also configured to determine a water vapor demand of processes to be carried out in the processing chambers, and configured to control the flow control device to regulate the flow rate of the water vapor being discharged through the steam discharge line so that a sum of flow rates of the water vapor being supplied to the processing chamber or chambers complies with the water vapor demand.

10. The substrate processing system according to claim 1 further comprising:
an additional ozone generator provided with electrodes and configured to generate an ozone-containing gas by applying an electric discharge produced by the electrodes of the additional ozone generator to an oxygen-containing gas supplied to the additional ozone generator; and
a valve adapted to stop supplying the oxygen-containing gas into the additional ozone generator,
wherein the controller is also configured to control the valve to stop supplying the oxygen-containing gas into the additional ozone generator in order to stop generating the ozone-containing gas by the additional ozone generator, when the ozone-containing gas demand is less than a predetermined value.

11. The system according to claim 1 further comprising a plurality of processing fluid discharge lines connected respectively to the processing chambers to discharge a processing fluid therefrom, each of the processing fluid discharge lines being provided therein with a flow control device.

12. The substrate processing system according to claim 1, wherein each of the ozone-containing gas supply lines is provided therein with a flow control valve adapted to control a flow rate of the ozone-containing gas supplied to the chamber connected to the ozone-containing gas supply line through the ozone-containing gas supply line, and wherein the controller is configured to determine the ozone-containing gas demand based on signals from the control valves which respectively indicate conditions of the flow control valves.

13. The substrate processing system according to claim 1, wherein the controller is configured to determine the ozone-containing gas demand based on a predetermined process recipe which defines a sequence of processes to be executed in the processing chambers.

* * * * *